US012128290B1

(12) United States Patent
Charalambides et al.

(10) Patent No.: US 12,128,290 B1
(45) Date of Patent: *Oct. 29, 2024

(54) DIGITAL PATCH FOR DISCRETE SIGNALING, A BASEBALL GLOVE INCLUDING SAME, AND RELATED METHOD OF MANUFACTURE

(71) Applicant: Lifeware Labs, LLC, Pittsburgh, PA (US)

(72) Inventors: Alexandros Charalambides, Pittsburgh, PA (US); Brian Stancil, Evans City, PA (US); Andrew Rape, Pittsburgh, PA (US); Nolen Keeys, Pittsburgh, PA (US); Carmel Majidi, Pittsburgh, PA (US); Philip LeDuc, Wexford, PA (US)

(73) Assignee: Lifeware Labs, LLC, Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/309,898

(22) Filed: May 1, 2023

Related U.S. Application Data

(63) Continuation of application No. 17/650,715, filed on Feb. 11, 2022, now Pat. No. 11,673,038, which is a
(Continued)

(51) Int. Cl.
*G08B 5/36* (2006.01)
*A63B 71/06* (2006.01)
(Continued)

(52) U.S. Cl.
CPC ........ *A63B 71/0622* (2013.01); *A63B 71/143* (2013.01); *G06F 3/1423* (2013.01);
(Continued)

(58) Field of Classification Search
USPC ........... 340/332, 908, 7.55, 7.21, 7.63, 669, 340/691.1, 384.1, 384.3, 384.6, 384.7
See application file for complete search history.

(56) References Cited

U.S. PATENT DOCUMENTS

| 3,655,189 A | 4/1972 | Alexander, Jr. |
| 6,120,374 A | 9/2000 | Akada et al. |

(Continued)

FOREIGN PATENT DOCUMENTS

| JP | 2006-229373 A | 8/2006 |
| JP | 2009-159447 A | 7/2009 |

(Continued)

*Primary Examiner* — Daniel Previl
(74) *Attorney, Agent, or Firm* — K&L Gates LLP

(57) ABSTRACT

An apparatus for communication, a system thereof, and methods of manufacture thereof are provided. The apparatus comprises a body and a printed circuit board (PCB) operatively coupled to the body. The PCB comprises a processing unit, a first communication module operatively coupled to the processing unit, and an array of assemblies. The first communication module is configured to communicate with a secondary communication module wirelessly. The array of assemblies comprises at least two rows and at least two columns. Each assembly comprises a switch and a light. The array of assemblies are operatively coupled to the processing unit. Each light is configured to change a state responsive to at least one of a change in state by the switch within the same assembly and a control signal from the first communication module.

35 Claims, 16 Drawing Sheets

Related U.S. Application Data continuation of application No. 17/395,765, filed on Aug. 6, 2021, now Pat. No. 11,266,897, which is a continuation of application No. 16/803,252, filed on Feb. 27, 2020, now Pat. No. 11,103,764.

(60) Provisional application No. 62/944,434, filed on Dec. 6, 2019, provisional application No. 62/831,391, filed on Apr. 9, 2019, provisional application No. 62/815,103, filed on Mar. 7, 2019.

(51) Int. Cl.
  *A63B 71/14* (2006.01)
  *G06F 3/14* (2006.01)
  *H05K 1/18* (2006.01)
  *H05K 5/00* (2006.01)

(52) U.S. Cl.
  CPC .............. *G08B 5/36* (2013.01); *H05K 1/189* (2013.01); *H05K 5/0017* (2013.01); *A63B 2071/0655* (2013.01); *A63B 2071/0663* (2013.01); *A63B 2071/0694* (2013.01); *A63B 2209/08* (2013.01); *A63B 2225/20* (2013.01); *A63B 2225/50* (2013.01); *A63B 2225/74* (2020.08); *H05K 2201/10189* (2013.01)

(56) References Cited

U.S. PATENT DOCUMENTS

| | | |
|---|---|---|
| 7,033,269 B2 | 4/2006 | Namba et al. |
| 7,361,084 B2 | 4/2008 | Takahashi et al. |
| 10,471,330 B1 | 11/2019 | Hart |
| 11,103,764 B1 | 8/2021 | Charalambides et al. |
| 11,266,897 B1 * | 3/2022 | Charalambides .... H05K 5/0017 |
| 11,673,038 B1 * | 6/2023 | Charalambides .... H05K 5/0017 340/332 |
| 2002/0094852 A1 | 7/2002 | Fujioka et al. |
| 2005/0282128 A1 * | 12/2005 | Brinkerhoff ....... A63B 69/0068 434/247 |
| 2007/0265043 A1 * | 11/2007 | Wang ..................... A63F 13/12 463/2 |
| 2008/0254888 A1 | 10/2008 | Morio et al. |
| 2010/0080390 A1 | 4/2010 | Daniel |
| 2013/0176401 A1 | 7/2013 | Monari et al. |
| 2016/0175091 A1 * | 6/2016 | Van Heugten ............ A61F 2/14 623/6.22 |

FOREIGN PATENT DOCUMENTS

| | | |
|---|---|---|
| WO | 2015/196246 A1 | 12/2015 |
| WO | 2021/113073 A1 | 6/2021 |

* cited by examiner

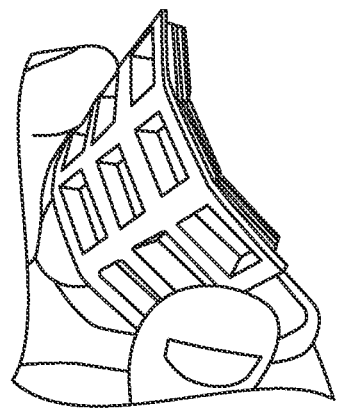
FIG. 3A
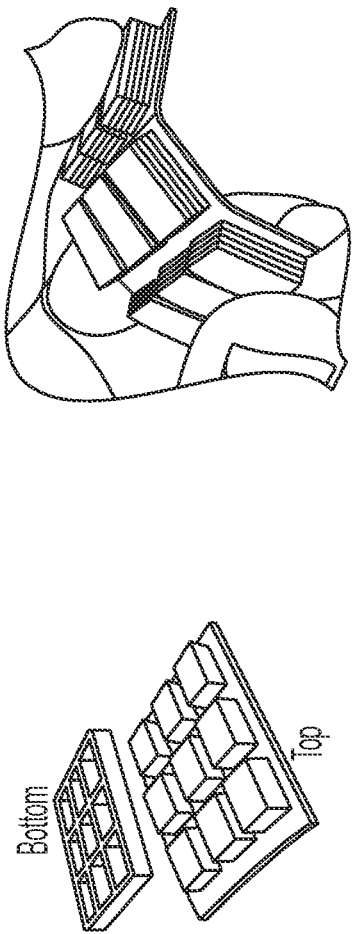
FIG. 3B
FIG. 3C
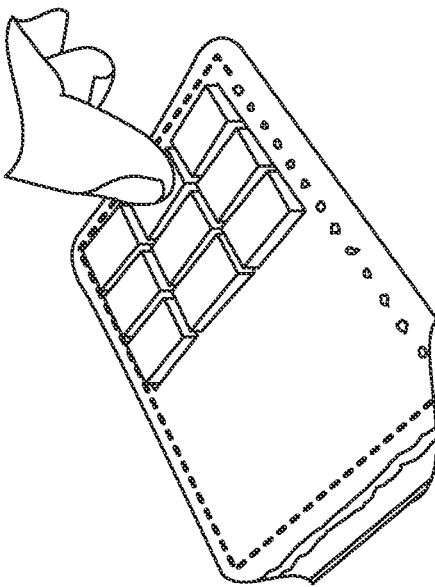
FIG. 3E
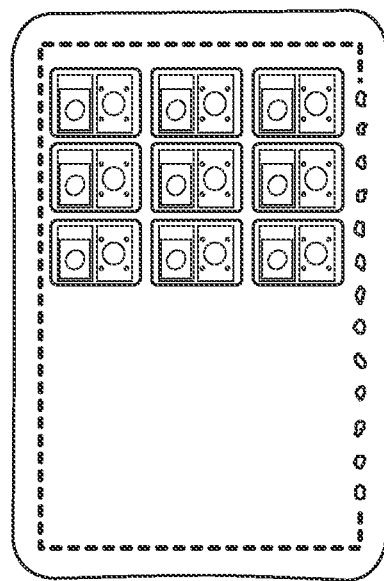
FIG. 3D

DIGITAL PATCH FOR DISCRETE SIGNALING, A BASEBALL GLOVE INCLUDING SAME, AND RELATED METHOD OF MANUFACTURE

PRIORITY CLAIM

The present application is a continuation application of U.S. patent application Ser. No. 17/650,715, filed Feb. 11, 2022, which, is a continuation application of U.S. patent application Ser. No. 17/395,765, filed Aug. 6, 2021, now U.S. Pat. No. 11,266,897, which is a continuation application of U.S. patent application Ser. No. 16/803,252, filed Feb. 27, 2020, now U.S. Pat. No. 11,103,764, which claims priority to the following United States provisional patent applications: (1) Ser. No. 62/815,103, filed Mar. 7, 2019; (2) Ser. No. 62/831,391, filed Apr. 9, 2019; and (3) Ser. No. 62/944,434, filed Dec. 6, 2019, all of which are incorporated herein by reference in their entirety.

BACKGROUND

In baseball, pitchers and catchers often communicate using nonverbal cues, such as hand gestures and head shakes, to select the next pitch, specifically the pitch type and pitch location. Communication is important before every pitch to enhance the chances of the catcher catching the pitch, which can be difficult if the pitcher throws a different type of pitch than the catcher expects. However, this gesture-based communication method is susceptible to being decoded by the opposing team so that the batter knows exactly what kind of pitch to expect. Possible communication alternatives such as earpieces have their own practical limitations, too. For example, earpieces are often drowned out by crowds and other ambient noise. Another important consideration is the speed of play; new solutions should not slow down the pace of the game.

SUMMARY

In a general aspect, various embodiments of the present invention are directed to a relatively small, signaling apparatus that is comprised of a printed circuit board (PCB) without a wireless communication module. The apparatus utilizes a wired-based communication module, such as serial or USB communication. This wired-based communication module is used to time-synchronize two apparatuses (e.g., one for the pitcher and one for the catcher) so that they display the same random array of alphanumeric characters at the same time. Additional apparatus may be synchronized after the first two are synchronized by connecting the additional apparatus to one of the synchronized apparatuses via a wired connection. The alphanumeric characters may be programmed to switch at a regular frequency, such as every 20 seconds or other desired frequency. The display of the apparatuses simultaneously cycle through these random alphanumeric characters to indicate a pitch key indicator, such as a digit from one through six, where the pitch key indicator is used to encode the true pitch signal. For example, a pitcher and catcher may each have a signaling apparatus on their glove or other article of clothing and may glance at the device and see the random number "3" displayed and, thus, utilize "3" as the pitch key. This indicates to the pitcher and catcher that the third hand gesture shown by the catcher is the true pitch signal, while other gestures are the decoy gestures. In this simplified approach, no buttons are necessary and any impact on the speed of the game of baseball is minimized. In some embodiments, this apparatus is attached to a glove or article of clothing via a spring-loaded clip attached to the back of the device. To help enhance privacy and prevent unwanted observers from acquiring the encoded signal on the apparatus, two layers of polarized film are applied over the display of the device, each oriented orthogonally to each other with respect to the direction of polarized light they block. This way, the number is visible when viewed from directly above the device but dark and unreadable from any other angle.

In another general aspect, the present invention is directed to a flexible communication apparatus with embedded electronics that can adhere to a leather glove, such as a baseball glove. The apparatus can comprise a PCB that comprises a processing unit, a first communication module operatively coupled to the processing unit, and a multidimensional array of light-and-button assemblies. The first communication module is configured to communicate wirelessly with a secondary communication module, e.g., another, separate baseball glove that has a similar flexible communication apparatus. That is, the catcher's mitt could have one of the flexible communication apparatuses and the pitcher's glove could have a second flexible communication apparatus, with the two in wireless communication to communicate pitch selections. The multidimensional array of assemblies may comprise at least two rows and at least two columns of assemblies. Each assembly comprises a switch and at least one light, e.g., a light-emitting diode(s) (LED). Preferably, each assembly comprises multiple different-colored lights, with each light indicating a pitch type (e.g., fastball, curveball). The assemblies are operatively coupled to the processing unit. Each light is configured to change a state (e.g., on and off, blink) in response to either (i) a change in state by the switch (e.g., the switch being pressed) within the same assembly, or (ii) a received control signal, such as from similar communication apparatus to which the apparatus is paired (e.g., a Bluetooth pairing, long-range (LoRa) communication). For example, a catcher could choose a pitch location, and cycle through the pitch-type options, by cyclically pressing the button corresponding to the desired location until the lighting pattern indicates the desired pitch type. For example, in a system with two lights-red and green-red may indicate a fastball, green may indicate a curveball, both red and green may indicate a changeup, and blinking red may indicate a slider. The catcher could press the button corresponding to the desired location until the desired pitch is selected. With respect to selecting pitch location, a consideration can be the perspective of the catcher compared to the perspective of the pitcher or other player on the field. When the catcher indicates a pitch location on their right-hand side, that manifests as a location on the pitcher's left-hand side, and vice versa. This mirrored left-right communication effect can be taken into account during wireless communication. With respect to selecting pitch type, one press may turn on the red light for fastball; a second press may turn on the green light for a curveball; a third press may turn on both lights to indicate a changeup; and a fourth press may rapidly turn red on and off to indicate a slider. Once the catcher's pitch selection is made, it may then be communicated wirelessly (e.g., Bluetooth, LoRa communication) to the communication apparatus on the pitcher's glove, which causes the corresponding light(s) on the pitcher's glove to turn on, thereby indicating the catcher's pitch selection, in terms of both pitch type and pitch location. The apparatus can comprise a vibration motor that can indicate, by vibrating, when a new pitch selection is received by the apparatus. That is, for example, the apparatus in the slave/pitcher's glove can vibrate when a pitch selection from the master/catcher's glove is received by the slave/pitcher's glove.

The PCB may be patterned and etched with copper traces as small as 100 microns. The board preferably is populated with a battery, power conditioning, a Bluetooth-enabled microprocessor, and multicolored LEDs and buttons. The PCB may be sewn into a small, e.g., 2 inch by 3 inch, pocket comprising a top layer of leather and bottom layer of fabric. The leather can be patterned using a computer numerical control (CNC) tool, such as a laser cutter, to create windows for the light-button assemblies as well as to engrave logos. In some embodiments, an injection molded silicone cover is placed over the light-button assemblies for environmental protection and to diffuse the LED light. A bioinspired adhesive, based off the adhesive used in nature by mussels, may be transferred to the cotton fabric. This adhesive is capable of binding to a multitude of materials, including the leather commonly found on baseball gloves. In some embodiments, the bottom layer of cotton fabric can be replaced by other materials, such as a hook-and-loop (e.g., Velcro)-receptive fabric. In this embodiment, the adhesive is transferred not to the patch but to a disposable hook-and-loop fastener, which is then temporarily attached to the patch.

The catcher's pitch selection may be communicated to other recipients in addition to or in lieu of the pitcher, such as other fielders, coaches, etc. In various embodiments, the array of switch-light assemblies is arranged into a 3 by 3 grid that corresponds to the "strike zone." By pressing a button in one of the nine zones, that zone's LED cycles through different colors. The location of the LED indicates the desired pitch location, while the color of the LED indicates desired pitch type. Lastly, to facilitate discrete communications, the LEDs are not persistent, meaning the LEDs are only illuminated for the player while that player is actively holding a button. Other nonpersistent mechanisms can also be implemented, such as a simple timer.

In another general aspect, embodiments are directed to a method for producing the communication apparatus. The method comprises, in various embodiments, forming a PCB having thereon the processing unit, the first communication module, and the multidimensional array of assemblies.

These and other benefits of the present invention will be apparent from the description to follow.

BRIEF DESCRIPTION OF THE DRAWINGS

The features and advantages of the examples, and the manner of attaining them, will become more apparent, and the examples will be better understood, by reference to the following description taken in conjunction with the accompanying drawings, wherein:

FIGS. 3A-E are images depicting an example of stages of forming and assembling a silicone cover layer on an apparatus for communication according to the present disclosure;

Corresponding reference characters indicate corresponding parts throughout the several views. The exemplifications set out herein illustrate certain embodiments, in one form, and such exemplifications are not to be construed as limiting the scope of the appended claims in any manner.

DESCRIPTION

Figure 13:
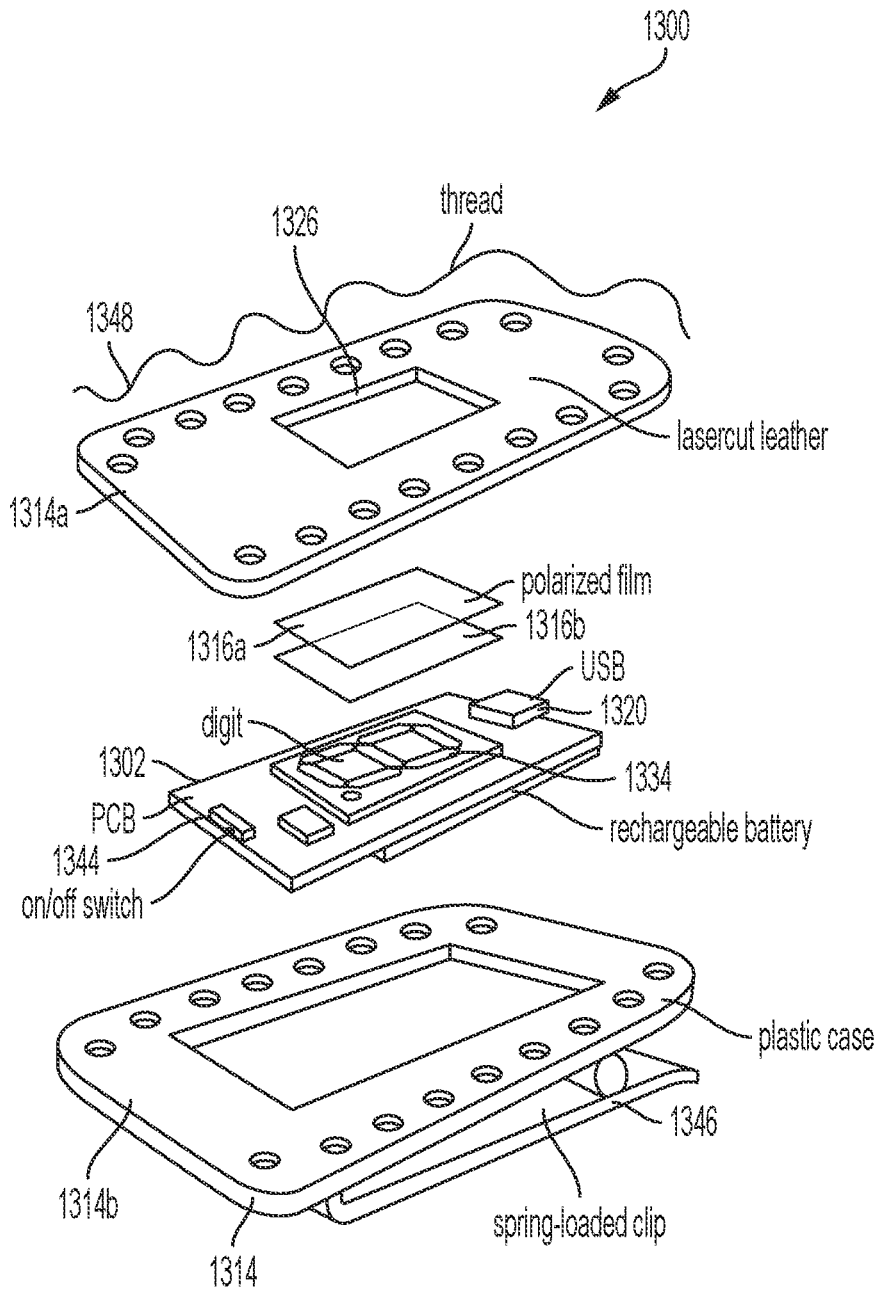
FIG. 13 is an image depicting an exploded view of an example of an apparatus for communication comprising a display according to the present disclosure.

An example of an apparatus 1300 for signaling according to various embodiments of the present invention is illustrated in an exploded view in FIG. 13. For example, the apparatus 1300 can be a body-wearable display device for communication among teammates on a sports team during a competitive team event. The competitive team event can be a baseball game (including similar sports such as a softball game) or other competitive event. For example, the competitive team event can be a football game (e.g., to facilitate communication of a play between a coach and a player, such as, for example, a defensive captain and/or quarterback), a soccer game, a basketball game, a hockey game, a cricket game, a volleyball game, or a lacrosse game.

The apparatus 1300 can comprise a body 1314 and a PCB 1302 operatively coupled to the body 1314. For example, the PCB 1302 can be bonded to the body 1314 with adhesive, fastened to the body 1314 with a fastener, sewn to the body 1314, or secured to the body 1314 in a pocket. The PCB 1302 could be rigid or flexible in such an embodiment.

The body 1314 can comprise a top layer 1314a and a bottom layer 1314b disposed underneath of the top layer 1314a. The top layer 1314a can comprise various materials, such as, for example, leather or cotton fabric. The bottom layer 1314b can comprise various materials, such as, for example, a polymer, leather, or cotton fabric. In various examples, the top layer 1314*a* comprises leather and the bottom layer 1314*b* comprises a polymer.

The body 1314 can be configured to attach to a baseball glove, an article of clothing, an article of sporting equipment, or a combination thereof. For example, the body 1314 can comprise a spring-loaded clip 1346 attached to the back of the bottom layer 1314*b* so that the body 1314 can be releasably clipped to sporting equipment of a teammate (e.g., a baseball glove) or other clothing article. The clothing article can comprise a wrist band, a sweat band, a sleeve, or a combination thereof. The body 1314 of the apparatus 1300 can also be operatively coupled to a wrist of a teammate. For example, the body 1314 can be embedded within a wrist band of a teammate and the wrist band can be operatively coupled to the wrist of the teammate.

The PCB 1302 can be positioned intermediate the top layer 1314*a* and the bottom layer 1314*b*. The top layer 1314*a* and the bottom layer 1314*b* can be attached to one another to form a pocket in the body 1314, which can receive and secure the PCB 1302 within the body 1314. For example, the top layer 1314*a* and bottom layer 1314*b* can be attached by at least one of a fastener, adhesive, and thread 1348 (e.g., sewn together).

The apparatus 1300 can comprise a display 1334, such as, for example, an alphanumeric display (e.g., seven-segment digit display). The display 1334 can be operatively coupled to the controller of the PCB 1302. For example, the display 1334 can be in electrical communication with the controller via an electrical route (e.g., a trace). The display 1334 can be configured to change a state responsive to, for example, a control signal from the controller on the PCB 1302. For example, the display 1334 may be programmed to change state at a regular frequency, such as, for example, every 20 seconds or other desired frequency. Thus, in a baseball setting, the apparatus 1300 can continually change state and may change state before each pitch is thrown.

The display 1334 can be illuminated and can be configured to display information, such as, for example, a pitch-type indicator, a pitch-location indicator, a pitch-key indicator, or a combination thereof. In various examples, the apparatus 1300 may not comprise buttons or may comprise a minimal amount of buttons, which may minimize any impact on the speed of the event.

The PCB 1302 can comprise various components, such as, for example, a clock, a controller, a communication module 1320, and a power switch 1344. The clock is configured to generate a control frequency. The clock may or may not comprise a crystal. The clock can be used in conjunction with the controller to generate the indicator on the display 1334. Thus, the indicator on the display 1334 may change at a first frequency based on the control frequency generated by the clock. The first frequency can be every 20 seconds, every 30 seconds, every 40 second, every 45 seconds, every minute, or another desired frequency.

The controller is in communication with the clock and can comprise various functionality, such as, for example, a processing unit operatively coupled to memory. The controller can be configured to establish a communication link between the apparatus 1300 and a second apparatus for signaling. For example, the controller of the PCB 1302 can be operatively coupled to the communication module 1320 of the PCB 1302. The communication module 1320 can be a wired communication module configured to establish a wired communication link via a wired communication protocol, and the apparatus 1300 may not comprise a wireless communication module. For example, the communication module 1320 can utilize serial communication (e.g., a magnetic snap connection, as illustrated in FIG. 14) or USB communication (e.g., USB connection, as illustrated in FIG. 13). In various embodiments, the communication module 1320 can comprise a wireless communication module configured to establish a wireless communication link via a wireless communication protocol.

Regardless of the type of communication module 1320 present on the PCB 1302, the controller can be configured to time-synchronize the apparatus 1300 with a second apparatus (not shown) so that the two apparatuses display the same information (e.g., random alphanumeric character or other display configuration) at the same time on their respective display. For example, the controller can be configured to synchronize the clock of the apparatus 1300 to a second clock of a second apparatus (not shown in FIG. 13) when the apparatus 1300 and the second apparatus are in communication via a communication link. Thus, the control frequency output by the clock of the apparatus 1300 and the second clock of the second apparatus can be substantially the same. By synchronizing the clocks, the display 1334 can display information synchronously with a second display of the second apparatus based on the clock of the PCB 1302. Additional apparatuses may also be synchronized by connecting the additional apparatus to one of the synchronized apparatus via their respective communication module. In various embodiments, the controller can be configured to terminate the communication link after the clock of the apparatus 1300 and the second clock of the second apparatus are synchronized. The apparatus 1300 may not comprise a radio.

In various examples, the display of two or more synchronized apparatuses (e.g., one for the pitcher and one for the catcher) can simultaneously cycle through random alphanumeric characters, such as, for example, the digits one through six, or other display configurations in order to encode the true pitch signal in a pitch key. For example, a pitcher and catcher may each have one of the synchronized apparatus on their respective glove or other article of clothing and may glance at their respective apparatus and see the random number "3" displayed on the digit display. This indicates to the pitcher and catcher that the third hand gesture shown by the catcher is the true pitch signal, while other gestures shown by the catcher (e.g., gestures 1-2 and 4+) are the decoy gestures. That way, if both the pitcher and catcher are wearing the apparatus, and the apparatuses are synchronized to display the same numbers, both the pitcher and catcher will know the new pitch key (that is, the refreshed number display on the apparatus) every 20 seconds (or some other pre-specified time period) to decipher the catcher's hand signals before each pitch. That is, as explained above, if the apparatuses display "3" before a pitch, the catcher's third hand gesture can signify the type of pitch to be thrown. Other position players could also wear the apparatus so that they too can be provided the key to decipher the catcher's hand signals.

It's possible that the pitcher and catcher may glance at their respective apparatuses one or two seconds apart and for the indicator to have changed within that period of time, resulting in each player having a different idea of the pitch key. Therefore, the apparatus can be programmed to indicate the alphanumeric character is going to change by, for example, blinking a displayed digit or blinking another component of the display in order to indicate that the digit is about to change, for example, within the next three seconds. That way, both players understand to wait for the alphanumeric character to change before reading the alphanumeric character.

The pitcher and catcher do not necessarily need to have the same apparatus configuration. The pitcher and catcher could use different display interfaces, as long as the apparatus are programmed to display the same number or other display configuration at the same time.

The top layer 1314a of the apparatus 1300 can comprise an opening 1326 corresponding to the digit display 1334. The opening 1326 can be formed by a tool, such as, for example, a laser cutter. The top layer 1314a can be oriented relative to the PCB 1302 to align the opening 1326 with the digital display 1334.

To help enhance privacy and prevent unwanted observers from acquiring the true pitch signal, a first cover layer 1316a can be placed over the display 1334. In various examples, a second cover layer 1316b can also be placed over the display 1334. Each cover layer 1316a and 1316b can comprise polarized film, and each cover layer 1316a and 1316b can be oriented orthogonally with respect the direction of polarized light that the other cover layer blocks. This way, the number or other display configuration on the display 1334 may only be visible when viewed from directly above the apparatus 1300 and may otherwise appear dark and unreadable from other angles.

Figure 14A:
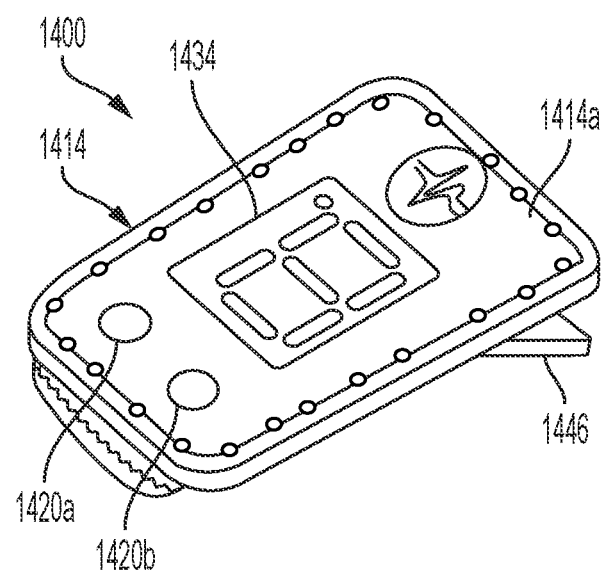
FIG. 14A is an image depicting a perspective view of an example of an apparatus for communication comprising a display according to the present disclosure.
Figure 14B:
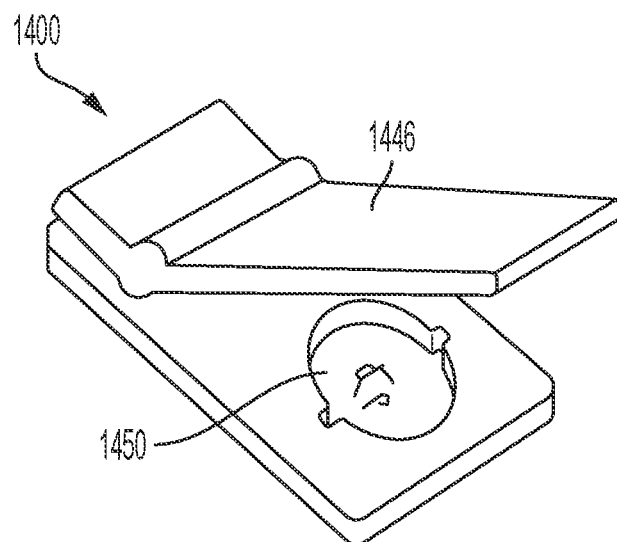
FIG. 14B is a back perspective view of the apparatus of FIG. 14A.
Figure 14C:
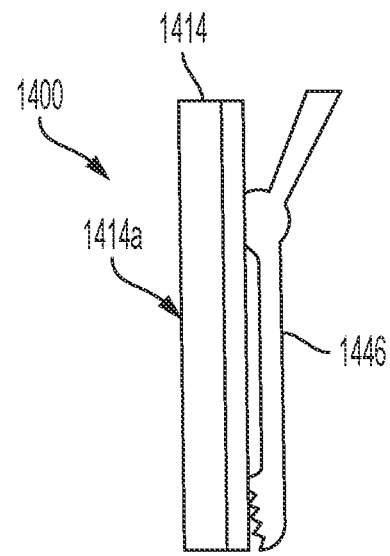
FIG. 14C is a side elevation view of the apparatus of FIG. 14A.

FIGS. 14A-C illustrate a body-wearable display device 1400 for communication among teammates on a sports team during a competitive team event. The device 1400 can comprise a body 1414, a PCB (not shown), a display 1434, and a communication module 1420. For example, the PCB can be bonded to the body 1414 with adhesive, fastened to the body 1414 with a fastener, sewn to the body 1414, or secured to the body 1414 in a pocket. The body 1414 can comprise a spring-loaded clip 1446 so that the body 1414 can be releasably clipped to sporting equipment of a teammate (e.g., a baseball glove) or other clothing article. The spring-loaded clip 1446 can comprise a metal, a metal alloy, a polymer, or a combination thereof. For example, the spring-loaded clip 1446 can comprise acrylonitrile butadiene styrene (ABS).

The PCB of the device 1400 can be positioned intermediate a top layer 1414a of the device 1400 and a bottom layer 1414b of the device 1400. The top layer 1414a and the bottom layer 1414b can be attached to one another to form a pocket in the body 1414, which can receive and secure the PCB within the body 1414.

Figure 15:
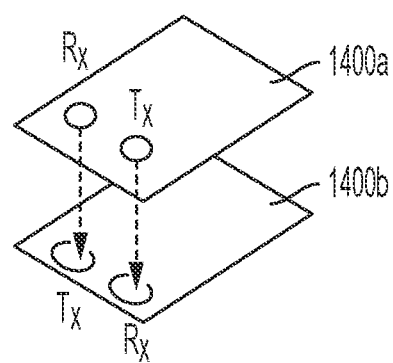
FIG. 15 is a schematic of two apparatuses according to the present disclosure during establishment of a communication link.

As illustrated, the communication module 1420 can comprise a magnetic snap connection comprising a first magnetic connector 1420a and a second magnetic connector 1420b. Each magnetic connector is in signal communication with a controller of the PCB. In an embodiment, the first magnetic connector 1420a can be configured to receive signals from the controller ($R_x$), and the second magnetic connector 1420b can be configured to transmit signals from the controller ($T_x$). As illustrated in FIG. 15, two devices 1400a and 1400b can be mated such that the respective magnetic connectors physically contact each other and establish a wired communication link. Utilizing a magnetic snap connector can reduce the thickness of the device 1400 by minimizing the size of the communication module 1420 and enable the communication module 1420 of the device 1400 to auto-locate with a second communication module of a second device.

Referring back to FIG. 14B, the device 1400 can comprise a battery 1450 (e.g., CR2016), which can be in electrical communication with the PCB. The device 1400 can be configured in an "always on" mode, so that it may not accidentally be turned off. Thus, the device 1400 can be synchronized once with a second device, and it may not have to be synchronized with that device again until the battery 1450 is depleted.

A method for communication among teammates on a sports team during a competitive team event according to the present disclosure is provided. The method comprises establishing a communication link between first and second body-wearable display devices. Establishing the communication link can comprise establishing a wired communication link or a wireless communication link between the first and second body-wearable display devices. Establishing the communication link can comprise establishing a point-to-point wireless communication link.

While the communication link is established, clocks on each of the first and second body-wearable display devices are synchronized. In various embodiments, after synchronizing the clocks, the method comprises terminating the communication link.

A first teammate during the event wears the first body-wearable display device, and a second teammate during the event wears the second body-wearable display device. Information is synchronously displayed by each of the first and second body-wearable display devices during the competitive team event. Wearing the first body-wearable display device can comprise operatively coupling the first body-wearable display device to a wrist of the first teammate, operatively coupling the first body-wearable display device to an article of clothing of the first teammate, operatively coupling the first body-wearable display device to an article of sport equipment worn by the first teammate, or a combination thereof. Operatively coupling the body-wearable display devices can utilize a spring-loaded clip.

Figure 7A:
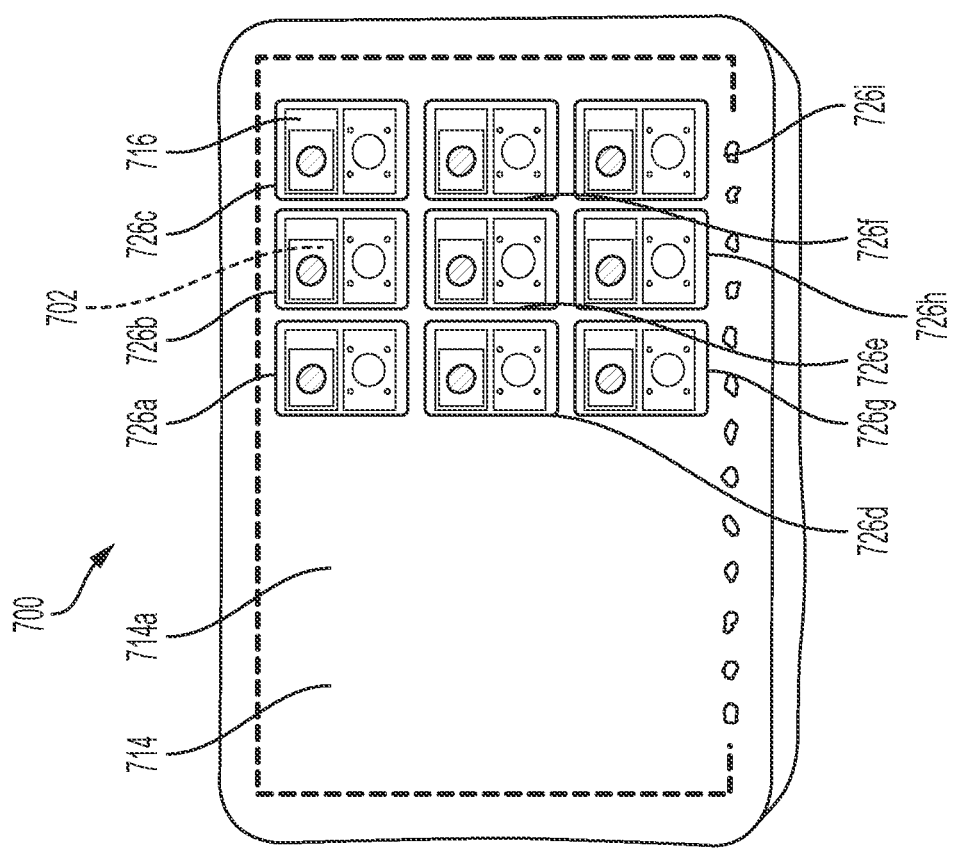
FIG. 7A is an image depicting an example of an apparatus for communication according to the present disclosure.
Figure 7B:
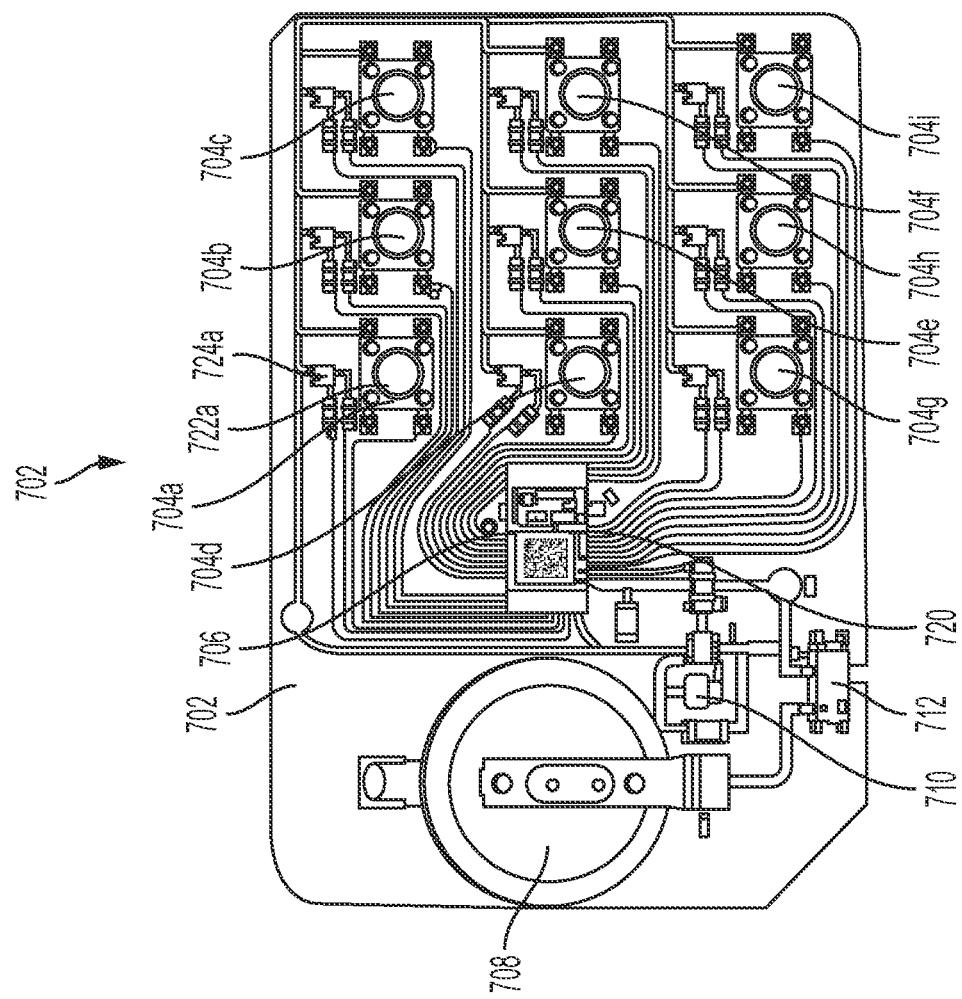
FIG. 7B is an image depicting an example of the PCB of the apparatus of FIG. 7A.

FIG. 7A shows a completed, communication apparatus 700, and FIG. 7B shows a printed circuit board (PCB) 702 thereof according to other embodiments of the present invention. As illustrated in these figures, the apparatus 700 comprises a body 714 and the PCB 702 operatively coupled to the body 714. For example, the PCB 702 can be bonded to the body 714 with adhesive, fastened to the body 714 with a fastener, sewn to the body 714, or secured to the body 714 in a pocket. The PCB can be a flexible PCB or a rigid PCB. In various examples, the communication apparatus 700 can be a flexible communication apparatus.

Figure 6:
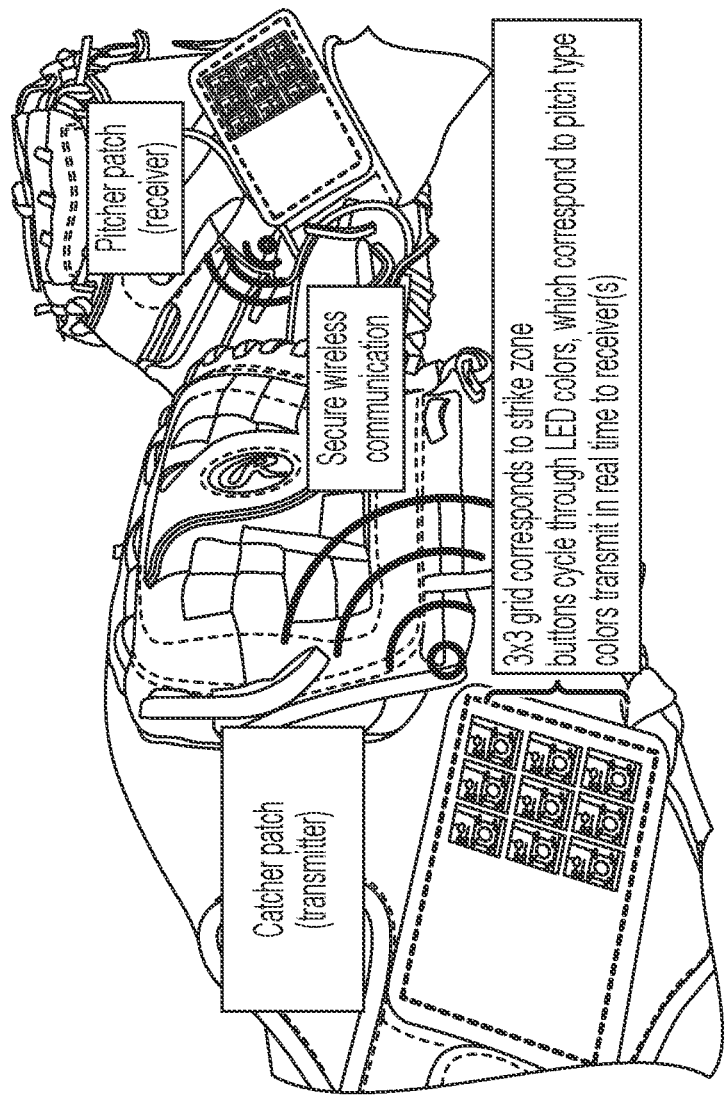
FIG. 6 is an image depicting a pair of apparatus for communication operatively coupled to baseball gloves according to the present disclosure.

The body 714 can be configured to attach to a baseball glove. For example, the body 714 can be attached to the backside wrist-strap portion a baseball glove, as illustrated in FIG. 6, so that it is not in or near the normal catching area or "pocket" of the glove.

The body 714 can comprise a top layer 714a and a bottom layer (not shown) disposed underneath of the top layer 714a. The top layer 714a can comprise various materials, such as, for example, leather or cotton fabric. The bottom layer can comprise various materials, such as, for example, leather, cotton fabric, or a hook-and-loop fastening material (e.g., Velcro) receptive layer. In various examples, the top layer 714a comprises leather and the bottom layer comprises cotton fabric.

The PCB 702 can be positioned intermediate the top layer 714a and the bottom layer. The top layer 714a and the bottom layer can be attached to one another to form a pocket in the body 714, which can receive and secure the PCB 702 within the body 714. For example, the top layer 714a and bottom layer can be attached by at least one of a fastener, adhesive, and thread (e.g., sewn together).

In various examples, an adhesive layer can be operatively coupled to the body 714, for example, the adhesive layer can be attached to the bottom layer of the body 714. The adhesive layer may cover at least a majority of the bottom layer of the body 714, or the adhesive may be divided into multiple discrete areas. For example, the area on the bottom layer of the body 714 near the communication module 720 may be intentionally left without adhesive, which can minimize radio frequency absorption from the wireless communications. The adhesive layer can be configured to securely attach the body 714 to a baseball glove. In various examples, a hook-and-loop fastening layer can be attached to the body 714. For example, the adhesive layer can be disposed onto the hook-and-loop fastening layer, and the hook-and-loop fastening layer can be operatively coupled to the bottom layer of the body 714. The adhesive layer can comprise a reusable adhesive, such as, for example, an adhesive based on the chemistry in mussels.

Referring to FIG. 7B, an isolated view of the PCB 702 is provided. The PCB 702 can comprise at least one of a rigid polymer, a flexible polymer layer, and a conductive layer. For example, the flexible polymer can be polyimide, polyether ether ketone (PEEK), or polyester. The conductive layer can comprise, for example, gold, silver, or copper. The PCB 702 can be single sided, double sided, multilayered, or combinations thereof. The PCB 702 can be formed by patterning the electrical routing layout onto a substrate and etching the substrate to form the electrical routing, which can be as small as 100 microns.

As illustrated, the PCB 702 comprises a processing unit 706, a communication module 720, and an array of pitch selection switch-light assemblies 704a-i comprising a switch 722a-i and a light(s) 724a-i. Each switch can comprise at least two states, such as, for example, a first state and a second state. The switch can be, for example, a button switch, a toggle switch, or a rocker switch. The switch can be momentary or latching. In examples comprising a momentary button switch, the first state can be the open state of the switch (e.g., not depressed) and the second state can be the closed state of the switch (e.g., depressed).

The light(s) preferably comprise a light emitting diode(s) (LED), although other light sources could be used. Preferably, the assemblies comprise multiple LEDs, which may be discrete LEDs that are part of a composite multicolored LED device. Each light can comprise at least two states, such as, for example, a first state (off) and a second state (on). The lights can also change between a constant on state, a flashing state, and changing the frequency of the flashes.

The array of assemblies 704a-i can comprise at least two rows and at least two columns. For example, the array of assemblies 704a-i can comprise three rows and three columns, with each assembly indicating a corresponding subzone of the strike zone (e.g., up and in, high and away, etc.). The array of assemblies 704a-i can be operatively coupled to the processing unit 706. For example, the light(s) of each assembly 704a-i can be in electrical communication with the processing unit 706 via an individual electrical route (e.g., a trace) and each switch of each assembly 704a-i can be in electrical communication with the processing unit 706 via an individual electrical route. Each light can be configured to change a state responsive to, for example, either (i) a change in state by the switch within the same assembly 704a-i, or (ii) where another apparatus (e.g., on the catcher's glove) is sending to the apparatus (e.g., on the pitcher's glove) a control signal from the communication module 720 that is responsive from the received signal from the catcher's glove. In various examples, each assembly 704a-i can comprise at least two lights, including a first light configured to emit a first wavelength of electromagnetic radiation (e.g., red) and a second light configured to emit a second wavelength of electromagnetic radiation (e.g., green) different from the first wavelength. In various other examples, each assembly 704a-i can comprise at least three lights, including the first light, the second light, and a third light, which can emit a blue light. At least two lights within each assembly 704a-i can be within the same component (e.g., a multicolored LED) or different components (e.g., two or more LEDs).

The PCB 702 can be formed with individual electrical routings (e.g., traces) according to formula 1:

$$\text{rows}*\text{columns}*\text{\# of assemblies}*(\text{\# of switch assembly}+\text{\# of lights assembly})=\text{\# of electrical routes} \quad \text{Formula 1}$$

The top layer 714a can comprise an array of openings 726a-i corresponding to the array of assemblies 704a-i. The array of openings 726a-i can be formed by a tool, such as, for example, a laser cutter. The top layer 714a can be oriented relative to the PCB 702 to align the array of openings 726a-i with the array of assemblies 704a-i. The alignment of the array of openings 726a-i with the array of assemblies 704a-i can enable access to the switches of the assemblies 704a-i when the apparatus 700 is assembled. Additionally, a logo or other feature can be engraved into the top layer 714a by a tool.

The communication module 720 can be operatively coupled to the processing unit 706 and configured to communicate with a secondary communication module (not shown) wirelessly. As used herein, the processing unit 706 and the communication module 720 can be separate components or within the same component (e.g., a Bluetooth-enabled microprocessor). The communication module 720 can utilize wireless communication protocols, such as, for example, Bluetooth wireless technology, ZigBee wireless technology, or LoRa wireless technology. LoRa is a low-power, wide-area-network (LPWAN) technology standard that uses chirp spread spectrum (CSS) radio modulation technology; other LPWAN standards could also be used in various embodiments. In various examples, Bluetooth Low Energy 5.0 is used as the wireless communication protocol. The communication between the communication module 720 and the secondary communication module can be unidirectional or bidirectional.

The PCB 702 can be populated with various other components, such as, for example, a battery 708, power conditioning circuitry 710, a power switch 712, and a communication port (e.g., USB).

The assemblies 704a-i can be left exposed in the finalized apparatus, or the assemblies 704a-i can be covered. For example, the assemblies 704a-i can be covered by a cover layer 716 disposed over the array of assemblies 704a-i. The cover layer 716 can comprise various materials, such as, for example, silicone. The cover layer 716 can be sprayed as a coating composition onto the assemblies 704a-i and thereafter cured to form the cover layer 716, or the cover layer 716 can be formed as a separate piece (e.g., molded piece) and placed over the assemblies 704a-i after forming. The cover layer 716 can be substantially transparent. For example, the cover layer 716 can enable the electromagnetic radiation emitted by the lights within each assembly 704a-i to be observed by a user. The cover layer 716 can protect the PCB 702 from the environment and diffuse electromagnetic radiation emitted by the lights in the assemblies 704a-i.

In one general aspect, therefore, embodiments to a system with at least two apparatuses for communication are described herein. One of the apparatus can be configured as a transmitter (e.g., a master), and one of the apparatus can be configured as a receiver (e.g., slave). In various examples, one of the apparatus can be configured as a transmitter (e.g., a master), and at least two of the apparatus can be configured as a receiver (e.g., slave). In various examples, at least two of the apparatus can be configured as a transmitter (e.g., a master), and one of the apparatus can be configured as a receiver (e.g., slave). In various examples, at least two of the apparatus can be configured as a transmitter (e.g., a master), and at least two of the apparatus can be configured as a receiver (e.g., slave). In various embodiments, in a baseball game context, the master unit may be on the catcher's glove and the slave unit could be on another glove, e.g., the pitcher's glove, to communicate the pitch selections therebetween.

In various embodiments, the communication apparatus can use the Bluetooth wireless protocol (e.g., the Bluetooth Low Energy). Bluetooth uses a master-slave relationship. Each slave must be paired with its master. As described herein, the communication apparatus on the pitcher's glove could be the slave and paired to the communication apparatus on the catcher's glove, which is the master, in a case where the catcher makes the pitch selections (or vice versa if the pitcher is making the pitch selections and communicating them to the catcher). A Bluetooth master can have multiple (although a relatively limited number of) slaves, such that the master communication apparatus (e.g., on the catcher's glove) could be in communication with and paired to additional slaves units, which may be communication apparatus on the glove of other fielders and/or other Bluetooth devices (e.g., mobile devices).

In other embodiments, the communication apparatus may use other wireless communication protocols, such as ZigBee, Z-Wave, WiFi, or LoRa communication. ZigBee and Z-Wave are mesh network protocols and permit many more nodes than Bluetooth. In various embodiments, the communication apparatus (e.g., on the catcher's glove) could use a Bluetooth protocol and transmit the pitch selection to a relay device (e.g., a gateway computer), which transmits the pitch selection, using ZigBee, Z-Wave or WiFi, for example, to a large number of recipient end units (e.g., communication apparatus of the fielders, coaches, spectators, broadcasters, statisticians). The relay could be remote from the master unit (e.g., on the catcher's glove) but still within Bluetooth range. In other embodiments, the relay could be integrated into the master communication unit (e.g., on the catcher's glove). In these manners, the pitch selection communication system could be extended to multiple devices, including communication apparatus on the gloves of other fielders, mobile devices of other recipients, etc. The recipient (e.g., slave) units may be similar to the master unit in terms of style and appearance, such as shown in FIG. 7A, or could be another type of mobile wireless device with suitable software (e.g., apps) for displaying the pitch selections, such as a smartphone, tablet, laptop, smartwatch, wearable computer, etc.

Figure 8:
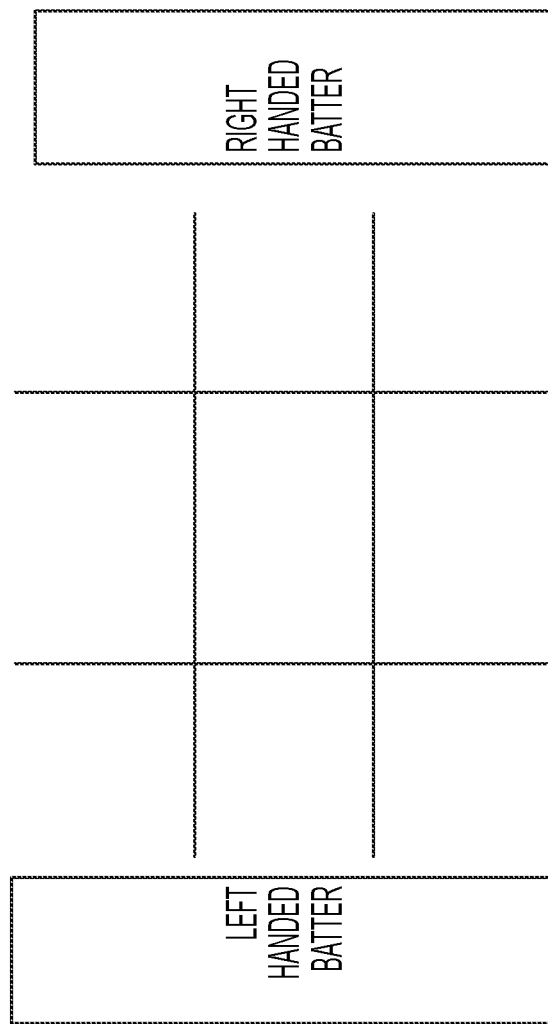
FIG. 8 is a schematic diagram of an example reference frame for a pitcher's apparatus according to the present disclosure.

In the example of a catcher's apparatus (e.g., a master) and a pitcher's apparatus (e.g., a slave), the array of assemblies 704a-i and/or the openings 726a-i can be arranged to correspond to the strike zone. Inputs from the master can be wirelessly communicated to the slave in real time, as illustrated in FIG. 6. By pressing a switch in a select one of assemblies of the catcher's apparatus, the light in the assembly can change state (e.g., cycle through different wavelengths (e.g., colors), turn off, turn on, flash). The location of the assembly with the light that changes state relative to the array of assemblies can indicate a desired pitch location, while the color (e.g., wavelength of electromagnetic radiation emitted by the light) of the light can indicate a desired pitch type (e.g., yellow=knuckle ball, green=curve ball, red=fast ball, blue=changeup). The catcher's apparatus can simultaneously communicate the state change to the pitcher's apparatus. Responsive to the communication, the pitcher's apparatus can change the state of a light in an assembly at a corresponding location to the light of the catcher's apparatus, thereby discretely communicating a pitch type and location to the pitcher. For example, if a curve ball in the bottom-right corner is desired, the catcher can press the switch in the bottom-right assembly 704i on the catcher's apparatus to cycle through the colors until green illuminates, which is simultaneously communicated to the pitcher's apparatus. With respect to selecting pitch location, a consideration can be the perspective of the catcher compared to the perspective of the pitcher or other player on the field. When the catcher indicates a pitch location on their right-hand side, that manifests as a location on the pitcher's left-hand side, and vice versa. This mirrored left-right communication effect can be taken into account during wireless communication. In various other examples, a consistent frame of reference can be shown on the catcher's apparatus and/or the pitcher's apparatus. For example, the array of assemblies 704a-i can be positioned relative to an indicator for a left-handed batter's box and/or a right-handed batter's box. For example, a schematic diagram of an example reference frame for a pitcher's apparatus according to the present disclosure is illustrated in FIG. 8. The catcher's apparatus may be the opposite of the pitcher's apparatus (e.g., the right-handed batter's box can be on the left relative to the array of assemblies, and the left-handed batter's box can be on the right relative to the array of assemblies).

Color schemes that are color-blind friendly can also be implemented, such as reds, blues, and turquoise for deuteranopia. To facilitate concealment of the lights, the lights can be programmed to illuminate only while a switch is being held, or they can also be operatively coupled to a timer (e.g., implemented by the processor). This way, when a player is not looking at the apparatus, the lights are off, which can conceal the pitch information while simultaneously saving battery life.

In various examples, to facilitate discrete communications, the lights may not be persistent, such as, for example, the lights may only illuminate while the switch is activated (e.g., a button switch is being held down). Other nonpersistent mechanisms can also be implemented, such as, for example, a timer.

Other suitable user interfaces besides the 3 by 3 grid could also be used. For example, the communication apparatus can comprise other electronic components aside from switches and lights, or the switches and lights can be configured in a different arrangement. For example, the user interface can comprise: a wearable computer, with a touchscreen display; a processor; and wireless communication circuitry, such as a smart watch or other suitable wearable computer, a flexible e-ink display, and/or arrows for indicating locations.

Figure 9:
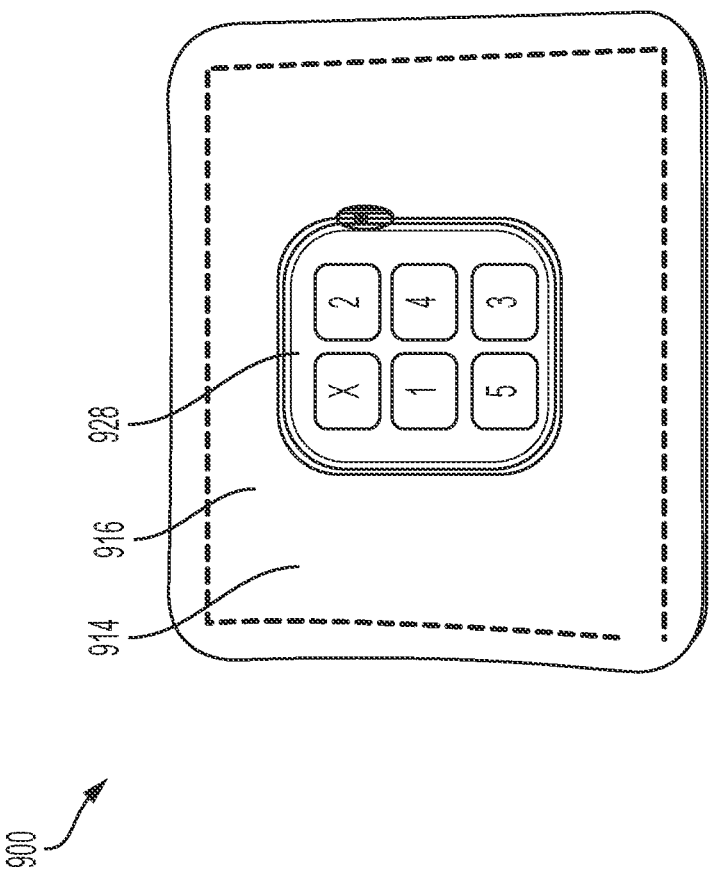
FIG. 9 is an image depicting an example of an apparatus for communication comprising a smart watch according to the present disclosure.

For example, as shown in FIG. 9, the communication apparatus 900 can comprise a body 914 and a wearable computer 928 with a capacitive touchscreen display, a processor, and wireless communication circuitry. In various embodiments, the wearable computer 928 could be implemented with a smart watch, such as, for example, an Apple Watch series 4 available from Apple Cupertino California (e.g., without the wrist strap), as illustrated in FIG. 9, instead of the PCB. The wearable computer 928 can comprise wireless communication circuitry, a battery, a touchscreen, a display, control logic, and other electronic functions, while the body 914 (e.g., leather patch) can be configured as a mechanical carrier that can be attached to a baseball glove or other sporting equipment via an adhesive disposed on the back (opposite the cover layer 916 shown in FIG. 9) of the body 914. A broad spectrum of user interfaces can be iterated on the wearable computer via software. The software can be configured to display appropriate interactive user interfaces to communicate pitch type and pitch location, as well as communications protocols for communicating with other gloves or devices. In various examples, a pitch-type selection screen can be randomized from pitch to pitch, for example, to minimize the chance of an opponent (e.g., batter, base runner, coach) observing what a catcher/pitcher may be inputting/observing.

Figure 10:
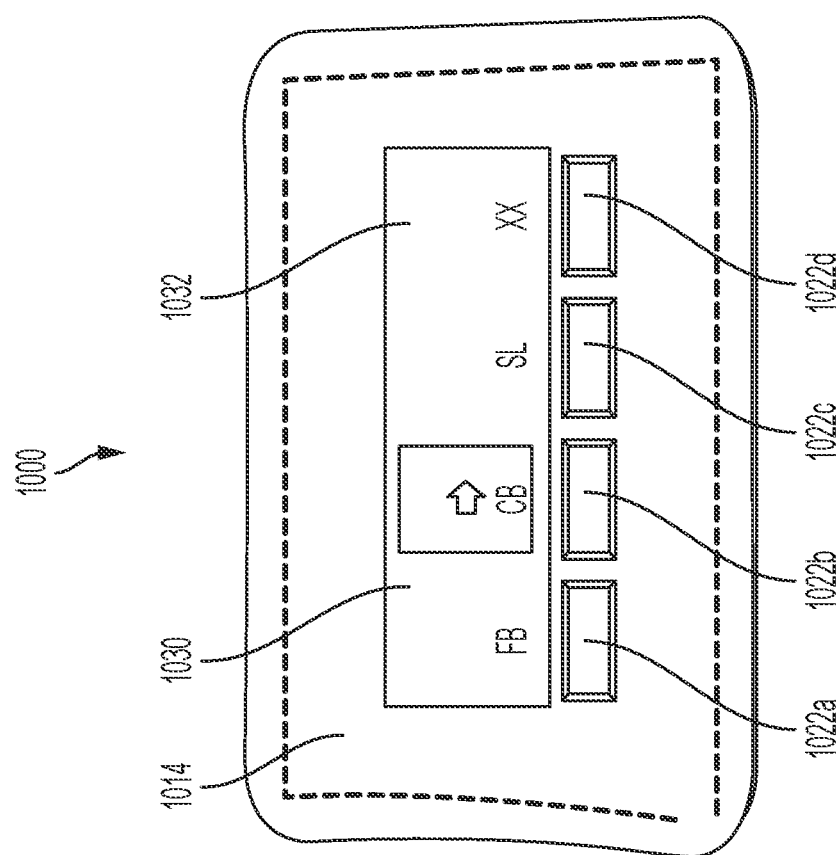
FIG. 10 is an image depicting an example of an apparatus for communication comprising a display according to the present disclosure.

As shown in FIG. 10, in some examples, the communication apparatus 1000 can comprise a body 1014, a PCB (not shown), and a display 1030 instead of lights, such as, for example, a flexible e-ink display, as illustrated in FIG. 10. The display 1030 can be a few inches wide. The display 1030 can comprise an interface 1032 that can change in real time and can be customized. For example, the interface 1032 on the display 1030 can change between interface configurations to provide additional menus and functionality to the communication apparatus 1000 as desired. In various examples, switches 1022a-d can be placed proximal to the display 1030 and in signal communication with the PCB in order to interact with the display 1030. As illustrated, a pitch-type display on the user interface 1032 can be "FB," which can indicate a fastball; "CB," which can indicate a curve ball; "SL," which can indicate a slider; and "XX," which can indicate another pitch type. The arrow displayed above the pitch type can indicate the pitch location. The location of the pitch types relative to one another can randomly change to minimize the chance of an opponent (e.g., batter, base runner, coach) observing what a catcher/pitcher may be inputting/observing. Pressing a switch 1022a-d can select the pitch type corresponding to the button, and multiple presses of the same switch can change the location of the pitch. In various examples, each switch 1022a-d comprises a multifunction switch similar to a directional pad, and the direction pressed on the multifunction switch can indicate the location of the pitch.

It may be desirable to limit the amount of "heads-down" time, which is the amount of time a player is looking down at the communication apparatus and, therefore, away from the game. The display or assemblies on the communication apparatus can be configured to minimize heads-down time.

Figure 11:
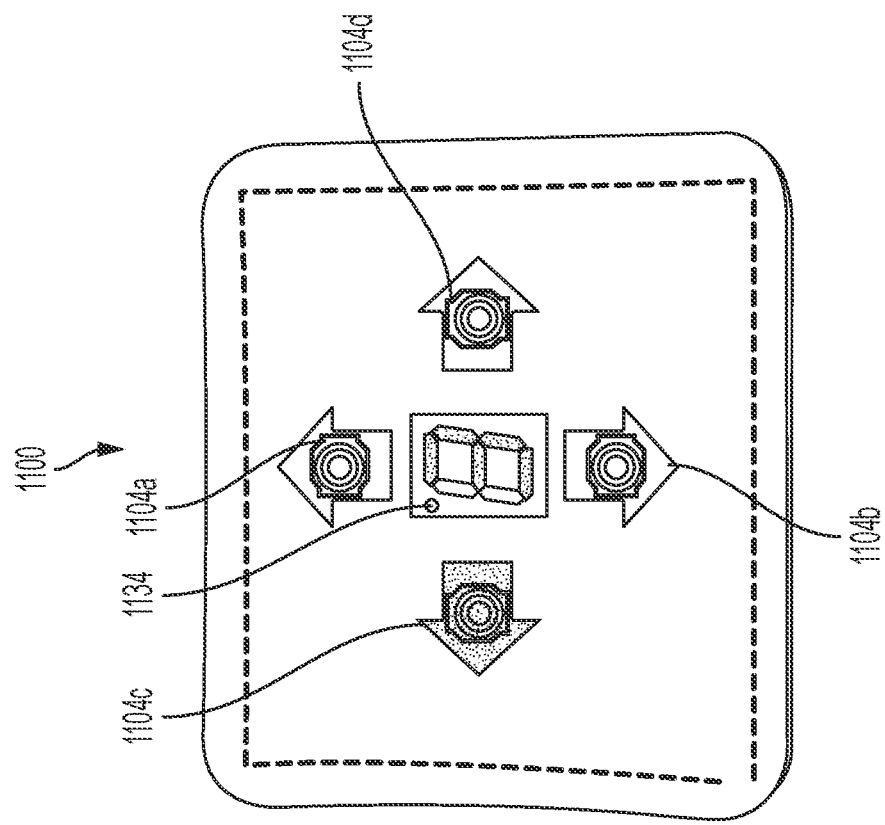
FIG. 11 is an image depicting an example of an apparatus for communication comprising an arrows and digit display according to the present disclosure.
Figure 12:
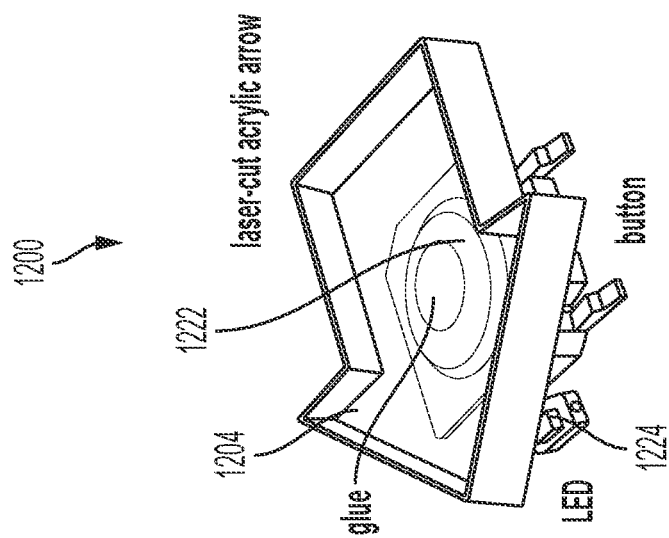
FIG. 12 is an image depicting an example of an arrow according to the present disclosure.

In some examples, the communication apparatus 1100 can comprise a different configuration of assemblies, such as, for example, a seven-segment digit display 1134 surrounded by arrows 1104a-d: up arrow 1104a, down arrow 1104b, left arrow 1104c, and right arrow 1104d, as illustrated in FIG. 11. The digit display 1134 and the arrows 1104a-d can comprise embedded switches (e.g., clickable) and can be illuminated (e.g., backlit) by a respective light. For example, a transparent arrow (e.g., laser cut acrylic) 1204 can be attached to a switch 1222 with a light 1224 adjacent to the switch 1222 as shown in FIG. 12. Referring back to FIG. 11, the arrows 1104a-d can indicate the pitch location, and the digit display 1134 can indicate pitch type. The digit display 1134 can decrease a learning curve for the communication apparatus 1100 as a number of fingers is already used to convey pitch type between a pitcher and a catcher in baseball. For example, an illuminated left arrow 1104c accompanied by the number "3," as illustrated in FIG. 11 can indicate a slider pitch to the left. The arrows 1104a-d can cycle through different visible/color wavelengths, turn off, turn on, and/or flash. For example, one click (e.g., change in state of switch 1222) can illuminate an arrow 1104a-d (e.g., turn on), a second click can cause an arrow 1104a-d to flash, and a third click can turn the arrow 1104a-d off. Flashing can indicate an "off-the-plate" or outside the strike zone pitch location. For example, a constant illumination of the down arrow 1104b can indicate a low pitch location, and a blinking illumination of the down arrow 1104b can indicate an "in the dirt" or a very low pitch location that should be outside the strike zone. Multiple arrows 1104a-d can be illuminated to indicate a corner pitch location, such as, for example, illuminating the up arrow 1104a and the right arrow 1104d simultaneously can indicate the upper right corner as the pitch location. For the pitch type, the digit display 1134 can comprise an embedded switch or at least two embedded switches. For example, a first embedded switch can be disposed towards the top of the digit display 1134 (e.g., closer to up arrow 1104a than down arrow 1104b) to increase the number on the digit display 1134, and a second embedded switch can be embedded towards the bottom of the digit display 1134 (e.g., closer to the down arrow 1104b than the up arrow 1104a) to decrease the number on the digit display 1134. This can be useful when the current pitch type is 5 and a 4 is desired or if a desired pitch type is accidentally passed while selecting.

The pitcher and catcher do not necessarily need to have the same display. The pitcher and catcher could use different display interfaces, as long as they are programmed to translate the commands from one interface to display on the other.

A method for producing an apparatus for communication according to the present disclosure is provided. The method can comprise forming the PCB and attaching the PCB to the body. The body can comprise a top layer and a bottom layer, and the PCB can be disposed intermediate the top layer and the bottom layer. The top layer can be attached to the bottom layer by, for example, sewing the top layer to the bottom layer. An array of openings can be formed in the top layer, and the array of assemblies can be aligned with the array of openings. The body can be attached to a baseball glove. An adhesive layer and/or a hook-and-loop fastening layer can be attached to the body. A cover layer can be disposed over the array of assemblies.

Examples

As illustrated and described herein, an apparatus according to the present disclosure was produced in the form of a patch. The patch comprised a PCB comprising a 3 by 3 array of assemblies, a Bluetooth enabled microprocessor, a power switch, a lithium battery, and a power conditioning assembly. Each assembly comprised a multicolored LED and a button switch. The patch shown in FIGS. 1A-E supported 27 individual electrical routings.

Figure 1C:
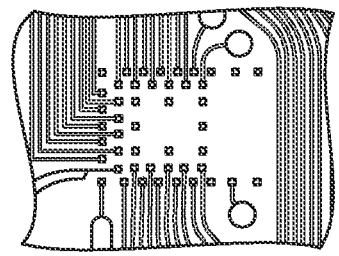
FIGS. 1A-E are images depicting an example of stages of production of an apparatus for communication according to the present disclosure.
Figure 1B:
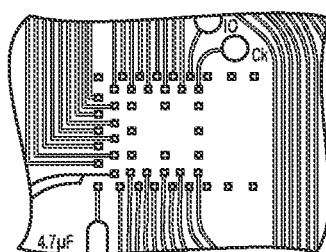
Figure 1E:
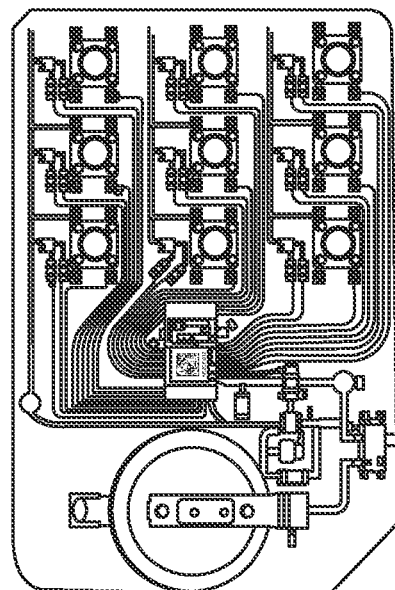
Figure 1A:
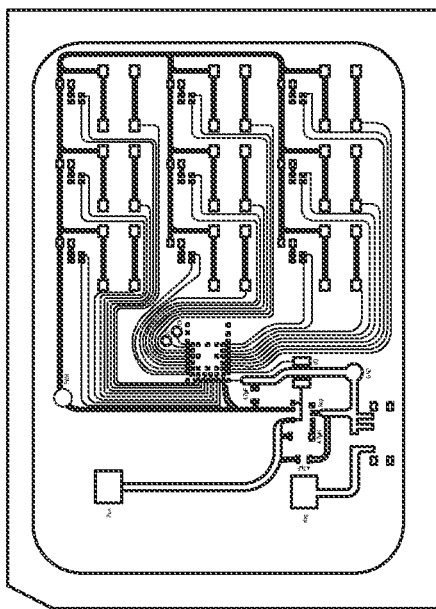

The PCB was formed by patterning the individual electrical routings on a copper substrate using a wax printer and a copper etchant solution was applied to the substrate to remove exposed copper to form the individual electrical routings. The wax was printed directly onto the PCB as shown in FIG. 1A. FIG. 1B illustrates a close-up of the electrical routing layout for the Bluetooth enabled microprocessor.

Figure 1D:
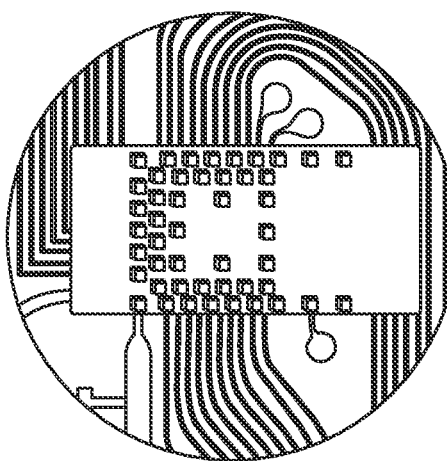

The individual copper pads (e.g., squares) shown in FIG. 1B are 400 microns in size and the copper traces are 100 microns which can enable a multitude of connections to the Bluetooth enabled microprocessor. In select locations where a copper trace joins a copper pad, a chamfer was be added to smooth the transition between the trace and pad which increased the mechanical strength of the joint. The PCB shown in FIGS. 1A-B, was etched using a solution of 30% by volume muriatic acid and 40% by volume hydrogen peroxide, with a ratio of 1 muriatic acid to 1.5 hydrogen peroxide. The PCB can be etched with various other etchants. The PCB was submerged in the solution for approximately 2-3 min to etch the exposed copper on the substrate (e.g., copper that was not covered in wax). The resulting PCB is shown in FIG. 1C. Referring to FIG. 1D, a Kapton solder mask for the microcontroller was laser cut, aligned, and adhered to the PCB to prevent electrical shorting of adjacent traces during soldering and remained on the PCB under the microcontroller. As illustrated in FIG. 1E, the remaining components, such as, a lithium polymer battery, power regulation assembly, assemblies of LEDs and button switches, and resistors were then soldered to the PCB.

Figure 2:
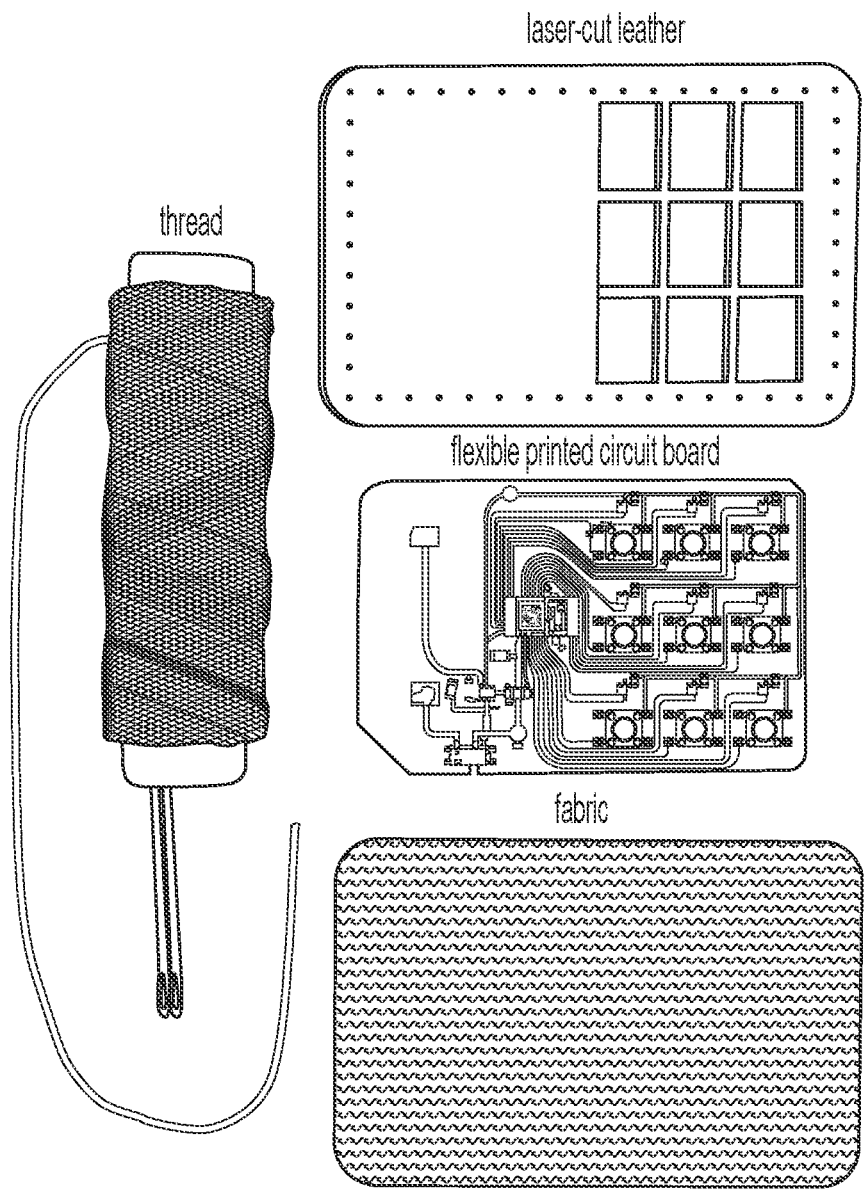
FIG. 2 is an image depicting an example of a disassembled apparatus for communication according to the present disclosure.

As illustrated in FIG. 2, a body comprising a top layer of leather and bottom layer of cotton fabric was formed with a pocket configured to receive the PCB. The pocket was 2 in by 3 in. The PCB was placed in the pocket and the top and bottom layers were sewn together to seal the PCB within the body. Due to the soft, deformable nature of the bottom layer of cotton fabric, the power switch for the PCB was accessible and manipulatable through the fabric layer despite not being visible. When stitching the two layers together, a small gap in the stitching can be left open if a USB connector for recharging or software reprogramming is provided on the PCB. The leather top layer was laser cut/engraved to create openings for the button switches and LEDs, holes for the stitching, and the logo for LifewearLabs.

A molded silicone cover layer, as illustrated in FIGS. 3A-E, can be disposed over the button switches. A two-part 3D-printed mold, as illustrated in FIG. 3A, can be used to create a silicone cover layer comprising an egg-crate shaped array. The bottom mold was filled with clear silicone, Dow Corning Sylgard 184, and then the top mold was aligned with and pressed into the bottom mold. As shown in FIGS. 3B-C, the silicone cover layer was formed with a 3 by 3 array of rectangular covers that can protect the embedded electronics in the patch. The two-part 3D-printed mold of FIG. 3A was formed with a nonplanar surface finish, which formed a surface roughness on the silicone cover layer. The surface roughness can enable diffusion of the LED light into a more-uniform glow, as illustrated in FIG. 3D, while the silicone cover can provide a tactile feel of the button switches, as illustrated in FIG. 3E.

Figure 4A:
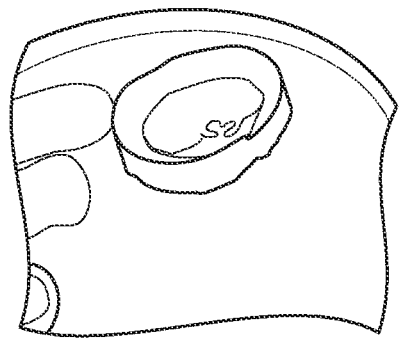
FIGS. 4A-D are images depicting an example of stages of assembling an adhesive layer on an apparatus for communication according to the present disclosure.
Figure 4C:
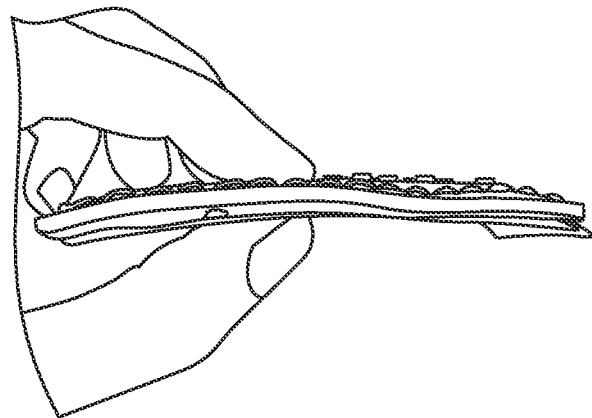
Figure 4B:
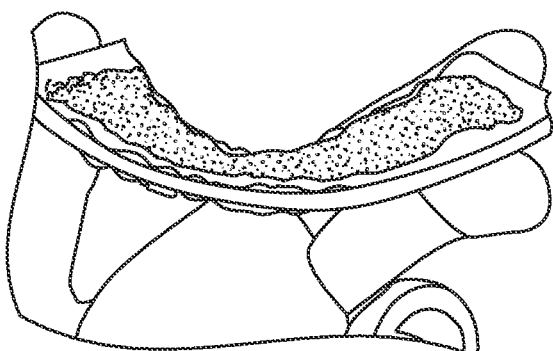
Figure 4D:
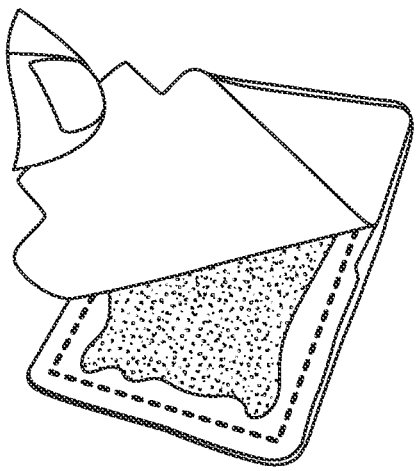
Figure 5B:
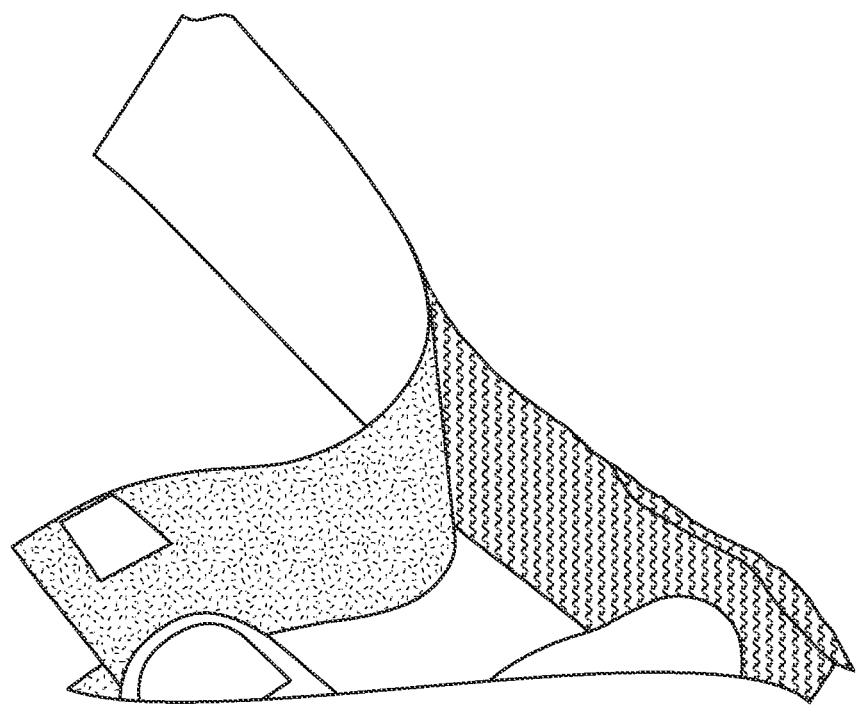
FIGS. 5A-B are images depicting an example of an adhesive layer attached to a hook-and-loop fastening layer according to the present disclosure.
Figure 5A:
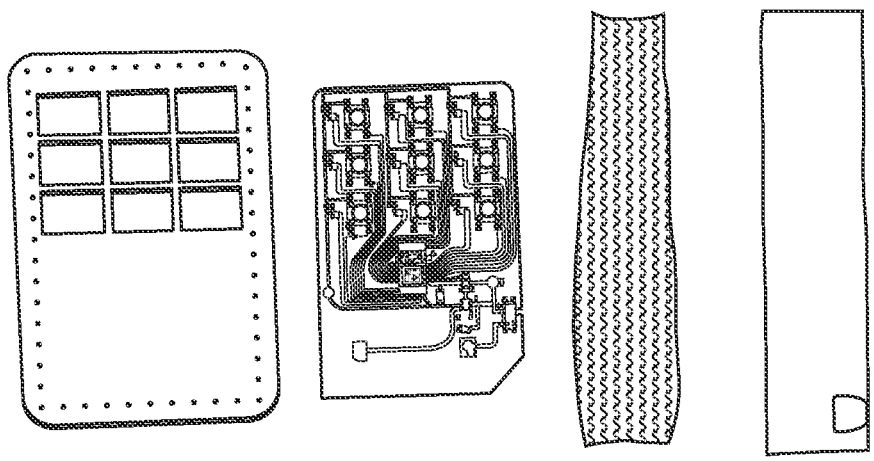

An adhesive layer was formed and applied to the patch. For example, dopamine hydroxide was dissolved in aqueous sodium hydroxide and held at room temperature for 15 minutes, resulting in the oxygen-mediated alkaline polymerization of dopamine monomers. The precursor solution was then mixed with acrylamide, N-N'-methylenebis(acrylamide), ammonium persulfate, tetramethylethylenediamine, and water to initiate a free radical mediated chain polymerization reaction. Immediately after mixing all components, the mixture was poured into a polydimethylsiloxane (PDMS)/polyurethane mold to form the final hydrogel into a desired shape. The mixture was allowed to polymerize for greater than one hour, resulting in the formation of a hydrogel network that is covalently linked via N-N'-methylenebis(acrylamide) and noncovalently cross-linked via electrostatic interactions of the dopamine-based moieties. The solid hydrogel was then carefully removed from the PDMS/polyurethane mold, resulting in the final adhesive product, as illustrated in FIG. 4A. The adhesive product was transferred to the bottom layer of the leather patch by manually bringing the substrate and adhesive product into conformal contact for 20 minute, as illustrated in FIG. 4B. After the 20 minutes of contact, a release liner that exhibits minimal adhesion to the adhesive product was applied to the exposed surface of the adhesive product, as illustrated in FIG. 4C. This liner contained a pull tab (e.g., an area of the liner that is not in contact with the adhesive product) such that the user can easily grab the pull tab and cleanly remove the liner from the adhesive product, as illustrated in FIG. 4D.

A second patch was created and both patches were attached to respective baseball gloves utilizing the adhesive layer, as illustrated in FIG. 6.

Various aspects of the invention include, but are not limited to, the aspects listed in the following numbered clauses and descriptions.

1. An apparatus for communication, where the apparatus comprises a body and a printed circuit board (PCB) operatively coupled to the body. The PCB comprises a processing unit and a first communication module operatively coupled to the processing unit and configured to communicate with a secondary communication module wirelessly. The PCB also comprises an array of assemblies comprising at least two rows and at least two columns, each assembly comprising a switch and a light, the array of assemblies are operatively coupled to the processing unit, each light is configured to change a state responsive to at least one of a change in state by the switch within the same assembly and a control signal from the first communication module.

2. The apparatus of clause 1, wherein the body is configured to attach to a baseball glove.

3. The apparatus of any one of clauses 1-2, further comprising a baseball glove, wherein the body is operatively coupled to the baseball glove.

4. The apparatus of any one of clauses 1-3, wherein the body comprises a top layer.

5. The apparatus of clause 3, wherein the top layer comprises leather.

6. The apparatus of any one of clauses 4-5, wherein the top layer comprises an array of openings and the top layer is oriented relative to the PCB to align the array of openings with the array of assemblies.

7. The apparatus of any one of clauses 4-5, wherein the body comprises a bottom layer.

8. The apparatus of clause 7, wherein the bottom layer comprises a cotton fabric.

9. The apparatus of any one of clauses 7-8, wherein the top layer is attached to the bottom layer.

10. The apparatus of any one of clauses 7-9, wherein the top layer is sewn to the bottom layer.

11. The apparatus of any one of clauses 1-10, comprising an adhesive layer operatively coupled to the body.

12. The apparatus of any one of clauses 1-11, comprising a hook-and-loop fastening layer operatively coupled to the body.

13. The apparatus of any one of clauses 1-12, wherein the PCB further comprises at least one of a battery and a power conditioning module.

14. The apparatus of any one of clauses 1-13, wherein each assembly comprises at least two lights. The at least two indicators including a first light configured to emit a first wavelength of electromagnetic radiation and a second light configured to emit a second wavelength of electromagnetic radiation different than the first wavelength.

15. The apparatus of any one of clauses 1-14, wherein the array of assemblies comprises three rows and three columns.

16. The apparatus of any one of clauses 1-15, comprising a cover layer disposed over the array of assemblies.

17. The apparatus of clause 16, wherein the cover layer comprises silicone.

18. The apparatus of any one of clauses 16-17, wherein the cover layer is substantially transparent.

19. The apparatus of any one of clauses 1-18, wherein the first communication module is configured to communicate with the secondary communication module via at least one of Bluetooth wireless technology, ZigBee wireless technology, and LoRa communication.

20. An apparatus for communication, the apparatus comprising a baseball glove and a PCB operatively coupled to the baseball glove. The PCB comprising a processing unit; a first communication module operatively coupled to the processing unit and configured to communicate with a secondary communication module wirelessly and an assembly. The assembly comprises a switch and a light. The assembly is operatively coupled to the processing unit. The light is configured to change a state responsive to at least one of a change in state by the switch and a control signal from the first communication module.

21. A system comprising at least two apparatuses according to any one of clauses 1-20, wherein one of the at least two apparatuses is configured as a transmitter and one of the at least two apparatus is configured as a receiver.

22. A system comprising a first apparatus for communication comprising a first body and a first PCB operatively coupled to the first body. The first PCB comprises a first processing unit, a first communication module operatively coupled to the processing unit, and a first assembly comprising a first switch and a first light. The first communication module is configured to communicate with a second communication module wirelessly. The first assembly is operatively coupled to the first processing unit. The first communication module is configured to send a first control signal to the second communication module responsive to a change in state of the first switch. A second apparatus for communication comprises a second body and a second PCB operatively coupled to the second body. The second PCB comprises a second processing unit, the second communication module operatively coupled to the processing unit, and a second light. The second communication module is configured to communicate with the first communication module wirelessly. The second communication module is configured to send a second control signal responsive to receipt of the first control signal from the first communication module. The second light is operatively coupled to the second processing unit. The second light is configured to change a state responsive to the second control signal from the second communication module.

23. The system of clause 22, wherein the first body is configured to attach to a baseball glove and the second body is configured to attach to a baseball glove.

24. The system of any one of clauses 22-23, further comprising a first baseball glove and a second baseball glove, wherein the first body is operatively coupled to the first baseball glove and the second body is operatively coupled to the second baseball glove.

25. A method comprising attaching the apparatus of any one of clauses 1-20 to a baseball glove.

26. A method for producing an apparatus for communication, the method comprising: forming a PCB comprising a processing unit, a first communication module operatively coupled to the processing unit, and an array of assemblies. The first communication module is configured to communicate with a secondary communication module wirelessly. The array of assemblies comprises at least two rows and at least two columns. Each assembly comprises a switch and a light. The array of assemblies are operatively coupled to the processing unit. Each light is configured to change a state responsive to at least one of a change in state by the switch within the same assembly and a control signal from the first communication module.

27. The method of clause 26, further comprising attaching the PCB to a body.

28. The method of clause 27, further comprising attaching the body to a baseball glove.

29. The method of any one of clauses 27-28, wherein the body comprises a top layer and a bottom layer, and further comprising disposing the PCB intermediate the top layer and the bottom layer.

30. The method of clause 29, further comprising attaching the top layer to the bottom layer.

31. The method of clause 30, wherein attaching the top layer to the bottom layer comprises sewing the top layer to the bottom layer.

32. The method of any one of clauses 26-31, comprising forming an array of openings in the top layer and aligning the array of assemblies with the array of openings.

33. The method of any one of clauses 26-32, further comprising attaching an adhesive layer or a hook-and-loop fastening layer to the body.

34. The method of any one of clauses 26-33, further comprising disposing a cover layer over the array of assemblies.

35. An apparatus for communication, the apparatus comprising a body, and a PCB operatively coupled to the body. The PCB comprises a processing unit, a first communication module operatively coupled to the processing unit, and an assembly comprising a switch and a display. The first communication module is configured to communicate with a secondary communication module wirelessly. The assembly is operatively coupled to the processing unit. The display is configured to change a state responsive to at least one of a change in state by the switch and a control signal from the first communication module.

36. An apparatus for signaling, the apparatus comprising a body and a PCB operatively coupled to the body. The PCB comprises a processing unit; a first communication module operatively coupled to the processing unit, and a first display configured to change a state simultaneously with a second display of the second apparatus. The first communication module is configured to synchronize the apparatus with a second apparatus.

37. The apparatus of clause 36, wherein the body is configured to attach to a baseball glove.

38. The apparatus of clause 36, wherein the body is configured to attach to an article of clothing.

39. The apparatus of any one of clauses 36-37, further comprising a baseball glove, wherein the body is operatively coupled to the baseball glove.

40. The apparatus of any one of clauses 36-39, comprising a spring-loaded clip operatively coupled to the body.

41. The apparatus of any one of clauses 36-40, comprising a cover layer disposed over the display.

42. The apparatus of clause 41, wherein the cover layer comprises polarized film.

43. The apparatus of any one of clauses 36-42, wherein the first communication module is configured to synchronized with the second apparatus, communication module via at least one of Bluetooth wireless technology, ZigBee wireless technology, and LoRa communication.

44. The apparatus of any one of clauses 36-43, wherein the first communication module is configured to communication with the second apparatus via a wired communication protocol.

45. A method for communication among teammates on a sports team during a competitive team event. The method comprises establishing a communication link between first and second body-wearable display devices. While the communication link is established, the method comprises synchronizing clocks on each of the first and second body-wearable display devices. The method also comprises wearing, by a first teammate during the event, the first body-wearable display device and wearing, by a second teammate during the event, the second body-wearable display device. Additionally, information is synchronously displayed by each of the first and second body-wearable display devices during the competitive team event.

46. The method of clause 45, further comprising after synchronizing the clocks, terminating the communication link.

47. The method of any one of clauses 45-46, wherein establishing the communication link comprises establishing a wired communication link between the first and second body-wearable display devices.

48. The method of clause 47, wherein neither the first wearable display device nor the second wearable display device comprises a radio.

49. The method of any one of clauses 47-48, wherein establishing the wired communication link comprises connecting the first body-wearable display device to the second body-wearable display device through a USB connection.

50. The method of any one of clauses 47-48, wherein establishing the wired communication link comprises connecting the first body-wearable display device to the second body-wearable display device through a magnetic snap connection.

51. The method of any one of clauses 45-46, wherein establishing the communication link comprises establishing a wireless communication link between the first body-wearable display device to the second body-wearable display device.

52. The method of clause 51, wherein establishing the communication link comprises establishing a point-to-point wireless communication link.

53. The method of any one of clauses 45-52, wherein wearing the first body-wearable display device comprises operatively coupling the first body-wearable display device to a wrist of the first teammate.

54. The method of clause 53, wherein the first body-wearable display device is embedded within a wrist band of the first teammate.

55. The method of any one of clauses 45-54, wherein wearing the first body-wearable display device comprises operatively coupling the first body-wearable display device to an article of clothing of the first teammate.

56. The method of clause 55, further comprising operatively coupling the first body-wearable display device to the article of clothing worn by the first teammate by a spring-loaded clip.

57. The method of any one of clauses 45-56, wherein wearing the first body-wearable display device comprises operatively coupling the first body-wearable display device to an article of sport equipment worn by the first teammate.

58. The method of clause 57, wherein the article of sport equipment is a baseball glove.

59. The method of any one of clauses 57-58, further comprising operatively coupling the first body-wearable display device to the article of sport equipment worn by the first teammate by a spring-loaded clip.

60. The method of any one of clauses 45-59, wherein the competitive team event is a baseball game.

61. The method of clause 60, wherein the first teammate is a catcher and the second teammate is a pitcher.

62. The method of any one of clauses 60-61, wherein the information synchronously displayed by each of the first and second body-wearable display devices during the event comprises a pitch-type indicator.

63. The method of any one of clauses 60-62, wherein the information synchronously displayed by each of the first and second body-wearable display devices during the event comprises a pitch-location indicator.

64. The method of any one of clauses 60-63, wherein the information synchronously displayed by each of the first and second body-wearable display devices during the event comprises a pitch-key indicator.

65. The method of any one of clauses 45-64, wherein the information synchronously displayed by each of the first and second body-wearable display devices during the event is an alphanumeric character.

66. The method of any one of clauses 45-65, wherein each display device comprises an alphanumeric display.

67. The method of any one of clauses 45-65, wherein each display device further comprises polarized film disposed over the alphanumeric display.

68. A body-wearable display device for communication among teammates on a sports team during a competitive team event. The body-wearable display device comprises a body; and a PCB operatively coupled to the body. The PCB comprises a first clock, a controller in communication with the first clock, and a first display that is communication with the controller. The controller is configured to synchronize the first clock to a second clock of a second body-wearable display device when the second body-wearable display device is in communication with the body-wearable device via a communication link. The first display is configured to display information synchronously with a second display of the second body-wearable display device based on the first clock.

69. The body-wearable display device of clause 68, wherein the controller is configured to terminate the communication link after the first and second clocks are synchronized.

70. The body-wearable display device of any one of clauses 68-69, wherein the wherein the controller is configured to communicate with the second body-wearable display device through a wired communication link.

71. The body-wearable display device of clause 70, wherein the PCB comprises a USB connection configured to establish the wired communication link.

72. The body-wearable display device of clause 70, wherein the PCB comprises a magnetic snap connection configured to establish the wired communication link.

73. The body-wearable display device of any one of clauses 68-69, wherein the controller is configured to communicate with the second body-wearable display device through a wireless communication link.

74. The body-wearable display device of any one of clauses 68-73, wherein the body is operatively coupled to a wrist of a first teammate.

75. The body-wearable display device of clause 74, wherein the body is embedded within a wrist band of the first teammate.

76. The body-wearable display device of any one of clauses 68-73, wherein the body is operatively coupled to an article of clothing worn by a first teammate.

77. The body-wearable display device of clause 76, further comprising a spring-loaded clip operatively coupled to the body and the article of clothing.

78. The body-wearable display device of any one of clauses 76-77, wherein the article of clothing comprises a wrist band, a sweat band, a sleeve, or a combination thereof.

79. The body-wearable display device of any one of clauses 68-78, wherein the body is operatively coupled to an article of sports equipment worn by a first teammate.

80. The body-wearable display device of clause 79, further comprising a spring-loaded clip operatively coupled to the body and the article of sports equipment.

81. The body-wearable display device of any one of clauses 79-80, wherein the article of sports equipment is a baseball glove.

82. The body-wearable display device of any one of clauses 68-81, wherein the competitive team event is a baseball game.

83. The body-wearable display device of clause 82, wherein the body-wearable display device is operatively coupled to a catcher and the second body-wearable display device is operatively coupled to a pitcher.

84. The body-wearable display device of any one of clauses 82-83, wherein the information synchronously displayed by the first display comprises a pitch-type indicator.

85. The body-wearable display device of any one of clauses 82-84, wherein the information synchronously displayed by the first display comprises a pitch-location indicator.

86. The body-wearable display device of any one of clauses 82-85, wherein the information synchronously displayed by the first display comprises a pitch-key indicator.

87. The body-wearable display device of any one of clauses 68-86, wherein the first display comprises an alphanumeric display.

88. The body-wearable display device of any one of clauses 68-87, further comprising a cover layer disposed over the first display.

89. The body-wearable display device of clause 88, wherein the cover layer comprises polarized film.

The herein described subject matter sometimes illustrates different components contained within, or connected with, different other components. It is to be understood that such depicted architectures are merely exemplary and that, in fact, many other architectures may be implemented that achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable" to each other to achieve the desired functionality. Specific examples of operably couplable include, but are not limited to, physically mateable and/or physically interacting components, wirelessly interactable and/or wirelessly interacting components, and/or logically interacting and/or logically interactable components.

One skilled in the art will recognize that the herein described articles and methods, and the discussion accompanying them, are used as examples for the sake of conceptual clarity and that various configuration modifications are contemplated. Consequently, as used herein, the specific examples/embodiments set forth and the accompanying discussion are intended to be representative of their more general classes. In general, use of any specific exemplar is intended to be representative of its class, and the noninclusion of specific components, devices, operations/actions, and objects should not be taken to be limiting. While the present disclosure provides descriptions of various specific aspects for the purpose of illustrating various aspects of the present disclosure and/or its potential applications, it is understood that variations and modifications will occur to those skilled in the art. Accordingly, the invention or inventions described herein should be understood to be at least as broad as they are claimed and not as more narrowly defined by particular illustrative aspects provided herein.

What is claimed is:

1. A system for discrete communication of a pitch selection during a competitive team event, the system comprising:
    a transmitter activatable by a first member during the competitive team event, the transmitter comprising:
        a first body; and
        a first printed circuit board (PCB) operatively coupled to the first body, the first PCB comprising:
            a first processing unit;
            a first communication module operatively coupled to the first processing unit and configured to communicate with a second communication module through secure wireless communication;
            a battery;
            a power switch;
            a communication port; and
            at least two pitch selection switches; and
    a receiver for a second member during the competitive team event, the receiver comprising:
        a second body,
        a second PCB operatively coupled to the second body, the second PCB comprising:
            a second processing unit operatively coupled to the second body;
            the second communication module;
            a battery;
            a power switch; and
            a communication port,
    wherein:
        in response to activating at least one of the pitch selection switches by the first member, the transmitter securely communicates a pitch selection control signal wirelessly to the receiver, wherein the pitch selection control signal is for a pitch selection that corresponds to the at least one of the pitch selection switches that is activated by the first member; and
        wherein the receiver is configured to indicate the pitch selection responsive to receipt of the pitch selection control signal.

2. The system of claim 1, wherein the communication between the first communication module and the second communication module is unidirectional.

3. The system of claim 1, wherein:
    the competitive team event involves a first team;
    the first member is a member of the first team; and
    the second member is a member of the first team.

4. The system of claim 1, wherein the receiver is configured to translate the pitch selection control signal and indicate the pitch selection based on the translation.

5. The system of claim 1, wherein:
the competitive team event involves a first team;
the first member is a member of the first team; and
the transmitter is worn on a wrist of the first member or a glove of the first member.

6. The system of claim 1, wherein:
the competitive team event involves a first team;
the second member is a member of the first team; and
the receiver is worn on a wrist of the second member or a glove of the second member.

7. The system of claim 1, wherein the receiver further comprises a vibration motor configured to vibrate responsive to receipt of the pitch selection control signal.

8. The system of claim 1, wherein the pitch selection switches are configured in a grid corresponding to a strike zone.

9. The system of claim 1, wherein the pitch selection switches are configured in three rows and three columns.

10. The system of claim 1, wherein the transmitter comprises a touchscreen display.

11. The system of claim 10, wherein the pitch selection switches are displayed on the touchscreen display.

12. The system of claim 1, wherein the pitch selection switches are depressible.

13. The system of claim 1, wherein the pitch selection switches are button switches.

14. The system of claim 1, wherein the transmitter is configured to securely communicate with the receiver via at least one of Bluetooth wireless technology, ZigBee wireless technology, and LoRa communication.

15. The system of claim 1, wherein the pitch selection control signal is encoded.

16. The system of claim 1, further comprising a second receiver that is configured to indicate a pitch selection responsive to receipt of the pitch selection control signal from the transmitter.

17. The system of claim 1, wherein the pitch selection includes pitch type, pitch location, or a combination thereof.

18. The system of claim 1, wherein the transmitter is configured to securely communicate with the receiver via LoRa communication.

19. The system of claim 1, wherein the competitive team event is a game selected from the group consisting of a baseball game and a softball game.

20. The system of claim 1, wherein the first member and the second member are selected from the group consisting a catcher, a pitcher, a fielder, a coach, a spectator, a broadcaster, and a statistician.

21. The system of claim 1, wherein:
the competitive team event involves a first team;
the first member is a catcher of the first team; and
the second member is a pitcher of the first team.

22. The system of claim 1, wherein the transmitter, the receiver, or both are selected from the group consisting of a smartphone, a tablet, a laptop, a smartwatch, and a wearable computer.

23. The system of claim 1, wherein the receiver comprises an e-ink display.

24. A method for discretely communicating pitch selections between a first member and a second member in a competitive team event, the method comprising:

selecting, by the first member, a pitch selection for an upcoming pitch by activating at least one of at least two pitch selection switches of a transmitter;
communicating the pitch selection to a receiver of the second member from the transmitter using a pitch selection control signal via secure wireless communication based on the activated at least one of the pitch selection switches; and
indicating, by the receiver, prior to the upcoming pitch, the pitch selection responsive to receipt of the pitch selection control signal from the transmitter.

25. The method of claim 24, further comprising translating the pitch selection control signal to a translated signal and indicating, by the receiver, prior to the upcoming pitch, the pitch selection based on the translated signal.

26. The method of claim 24, wherein indicating, by the receiver, prior to the upcoming pitch, the pitch selection responsive to receipt of the pitch selection comprises vibrating, by the receiver.

27. The method of claim 24, wherein the secure wireless communication is LoRa communication.

28. The method of claim 24, further comprising wearing, by the second member, the receiver on a wrist or a glove.

29. The method of claim 24, wherein the pitch selection switches are activatable by touching a touchscreen display on the transmitter or depressing the pitch selection switches.

30. The method of claim 24, wherein the transmitter is configured to securely communicate with the receiver via LoRa communication.

31. The method of claim 24, wherein the competitive team event is a game selected from the group consisting of a baseball game and a softball game.

32. The method of claim 24, wherein the first member and the second member are selected from the group consisting a catcher, a pitcher, a fielder, a coach, a spectator, a broadcaster, and a statistician.

33. The method of claim 24, wherein the transmitter, the receiver, or both are selected from the group consisting of a smartphone, a tablet, a laptop, a smartwatch, and a wearable computer.

34. The method of claim 24, wherein indicating, by the receiver, prior to the upcoming pitch, the pitch selection responsive to receipt of the pitch selection control signal from the transmitter comprises displaying the pitch selection on an e-ink display.

35. A system for discrete communication of a pitch selection during a competitive team event, the system comprising:
a transmitter activatable by a first member during the competitive team event, the transmitter comprises at least two pitch selection switches and the transmitter is configured to communicate a pitch selection to a receiver for an upcoming pitch using a pitch selection control signal via secure wireless communication responsive to activation of at least one of the pitch selection switches; and
the receiver configured to indicate to a second member, prior to the upcoming pitch, the pitch selection responsive to receipt of the pitch selection control signal from the transmitter.

* * * * *